United States Patent
Kimura

(10) Patent No.: US 7,471,141 B2
(45) Date of Patent: Dec. 30, 2008

(54) FILTER CIRCUIT

(75) Inventor: Katsuji Kimura, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 11/337,696

(22) Filed: Jan. 24, 2006

(65) Prior Publication Data

US 2006/0164159 A1 Jul. 27, 2006

(30) Foreign Application Priority Data

Jan. 25, 2005 (JP) ............................. 2005-016903

(51) Int. Cl.
*H03K 5/00* (2006.01)
(52) U.S. Cl. ...................... 327/552; 327/558
(58) Field of Classification Search .......... 327/551–559
See application file for complete search history.

(56) References Cited

U.S. PATENT DOCUMENTS 5,179,359 A * 1/1993 McLeod ...................... 331/38
5,230,011 A * 7/1993 Gielis et al. ................. 375/344
5,564,089 A * 10/1996 Barrett, Jr. ................ 455/196.1
5,602,847 A * 2/1997 Pagano et al. ............... 370/484
5,614,860 A * 3/1997 Osaki et al. .................. 327/552
5,887,030 A * 3/1999 Sasaki et al. ................. 375/229
6,011,770 A * 1/2000 Tan ........................ 369/124.13
6,791,401 B2 * 9/2004 Miwa .......................... 327/556

OTHER PUBLICATIONS

C. Shi et al., "Design of a Low-Power CMOS Baseband Circuit for Wideband CDMA Testbed," Proceedings of International Symposium on Low Power Electronics and Design (ISLPED 2000), Jul. 26-27, 2000, pp. 222-224, Figure 1.

* cited by examiner

*Primary Examiner*—Dinh T. Le
(74) *Attorney, Agent, or Firm*—McGinn IP Law Group, PLLC

(57) ABSTRACT

Disclosed is a filter circuit with an order of three or more, comprising at least one means for amplifying an in-band signal, wherein the frequency response of the filter output has a desirable attenuation characteristic obtainable with the order of the filter circuit. The gain of the amplifying means is variably controlled.

20 Claims, 23 Drawing Sheets

FILTER CIRCUIT

FIELD OF THE INVENTION

The present invention relates to a filter circuit and particularly to an on-chip filter circuit suitably integrated on an LSI chip.

BACKGROUND OF THE INVENTION

FIG. 1 is a diagram showing the configuration of a conventional filter circuit. The conventional filter circuit comprises two filters, which have respectively desired attenuation characteristic, and which are disposed in front of and behind an amplifier, respectively, to realize a steep frequency response and a high voltage gain between an input and an output of the filter circuit. More specifically, the conventional filter circuit, as shown in FIG. 1, comprises a 5th-order Low Pass Filter (abbreviated to LPF) and a 4th-order LPF disposed in the preceding and succeeding stages of the amplifier, respectively. In an article (Non-Patent Document 1), there is disclosed a receiver in which two LPFs are disposed in front of and behind an amplifier. These two LPFs, which are termed channel selection filters, for which an attenuation characteristic of 80 dB is required at the bandwidth between neighboring channels. Since a maximum voltage gain of approximately 80 dB is demanded in the baseband unit in such a direct conversion receiver, amplifiers are provided both in front of the preceding stage 5th-order LPF and behind the succeeding stage 4th-order LPF.

These three amplifiers are variable gain amplifiers (abbreviated to 'VGA'). A high gain amplifier having a gain of 80 dB not only an input noise, but also a noise generated in the amplifier, resulting in high noise level at the output and poor signal-to-noise ratio (S/N ratio). This is why LPFs are provided separately at different stages.

Each of LPFs described in the article (Non-Patent Document 1) is an active filter and generates a noise inside the circuit, and hence the placement of noise sources and filters becomes important in order to achieve a desired S/N ratio.

In case where the amplifier in FIG. 1 is assumed to be a linear type one, the relationship between the input signal and the output signal is expressed by the product of the transfer function of the 5th-order LPF in the preceding stage of the amplifier, the voltage gain of the amplifier, and the transfer function of the 4th-order LPF in the succeeding stage of the amplifier.

Accordingly, in the frequency response of the entire circuit shown in FIG. 1, the −3 dB cut-off frequency ($f_c$) of the entire circuit is lower than the −3 dB cut-off frequency ($f_c+f_1$) (where $f_1>0$) of the 5th-order LPF in the preceding stage of the amplifier and the −3 dB cut-off frequency ($f_c+f_2$) (where $f_2>0$) of the 4th-order LPF in the succeeding stage of the amplifier.

The attenuation characteristic of the 5th-order LPF in the preceding stage of the amplifier has a slope of −30 dB/Octave as from the −3 dB cut-off frequency ($f_c+f_1$) in case of the 5th-order LPF having the Butterworth characteristic. The attenuation characteristic of the 4th-order LPF in the succeeding stage of the amplifier has a slope of −24 db/Octave as from the −3 dB cut-off frequency ($f_c+f_2$) in case of the 4th-order LPF having the Butterworth characteristic.

On the other hand, since the attenuation characteristic of a 9th-order LPF has a slope of −54 dB/Octave as from the −3 dB cut-off frequency if the 9th-order LPF is a Butterworth filter, an attenuation amount of 54 dB might be obtained at a frequency which is twice the −3 dB cut-off frequency ($2f_c$). However, only an attenuation amount of less than 50 dB is obtained at the frequency $2f_c$ in FIG. 1.

In order to realize an attenuation amount of 50 dB or more at the frequency $2f_c$, it is necessary to:

increase the order of a filter by one, changing the 4th-order LPF in the succeeding stage of the amplifier to a 5th-order LPF, or change the 5th-order LPF in the preceding stage of the amplifier to a 6th-order LPF.

[Non-Patent Document 1]

C. Shi et al., "Design of A Low-Power CMOS Baseband Circuit for Wideband CDMA Testbed," Proceedings of International Symposium on Low Power Electronics and Design (ISLPED 2000), 2000 Jul. 26-27, pp. 222-224, FIG. 1.

SUMMARY OF THE DISCLOSURE

The conventional technology described above has the following problems.

The first problem is that it is difficult for the filter circuit to achieve a desired attenuation characteristic corresponding to the order thereof. The reason is that the −3 dB cut-off frequency of the filter circuit composed by a plurality of filters connected to each other in a cascade connection, becomes lower than the −3 dB cut-off frequency of each of the plurality of filters constituting the circuit.

The second problem is that in order to realize a desired attenuation characteristic, the number of circuit components and a chip size are increased. The reason is that the orders of filters have to be made higher to realize a desired attenuation characteristic.

The third problem is an increase in current consumption of the filter circuit. It is because the increase in the order of the filters incurs the increase in the number of circuit elements.

The present invention has been invented to solve the above-mentioned problems.

The invention disclosed in the present application is configured as follows:

A filter circuit in accordance with one aspect of the present invention, which has an order of three or more, comprises at least one means for amplifying an in-band signal, such that the frequency response at an output of said filter circuit has a desirable attenuation characteristic obtainable with the order of the filter circuit. Preferably, in the present invention, the gain of the amplifying means is variably controlled.

The meritorious effects of the present invention are summarized as follows. The present invention enables a desirable attenuation characteristic to be achieved while keeping the order of the filter to a minimum. The reason is that in the present invention the filter circuit comprises an amplifier for making the frequency response of the filter a desirable attenuation characteristic.

According the present invention, the current consumption can be reduced. The reason is that in the present invention, the order of the filter is kept to a minimum.

According the present invention, the chip area can be reduced. The reason is that in the present invention, the filter including the amplifier is realized while keeping the order of the filter to a minimum in the present invention.

According the present invention, an excellent noise characteristic can be achieved. The reason is that in the present invention, the noise amplified by the amplifier can be attenuated by a filter in a succeeding stage in the present invention.

Still other features and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED EMBODIMENTS OF THE INVENTION

Embodiments for carrying out the present invention will be described in detail with reference to the drawings.

Figure 1:
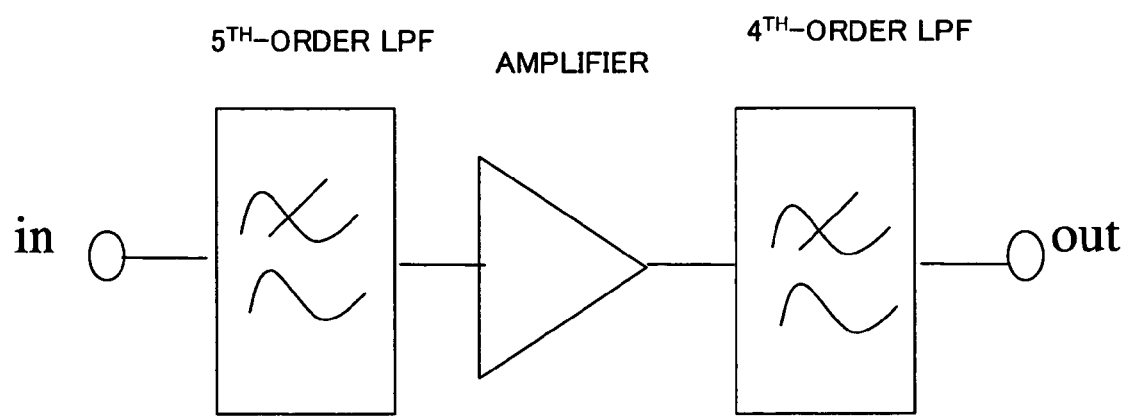
FIG. 1 is a diagram showing a conventional filter circuit.
Figure 2:
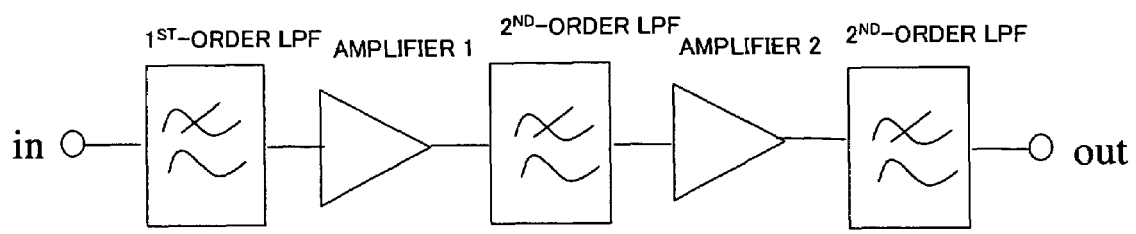
FIG. 2 is a diagram showing the filter circuit of the present invention.

FIG. 2 is a drawing showing the configuration of a mode of carrying out the present invention. Referring to FIG. 2, in the present mode, a fifth-order filter is divided into a 1st-order filter block and 2nd-order filter blocks, and amplifiers are inserted between neighboring filter blocks. Each 2nd-order filter block is not a complete filter such as a 2nd-order Butterworth filter or 2nd-order Chebychev filter. The combination of all 2nd-order filter blocks realizes a complete $n^{th}$-order Butterworth filter or $n^{th}$-order Chebychev filter.

The design of such a 1st-order filter block and 2nd-order filter blocks is able to be carried out by using for example a filter circuit realization method called the Biquad method. Note that, in the Biquad method, a transfer function of a desired filter characteristic is decomposed into a product of 1st-order or 2nd-order transfer function. A 1st-order filter circuit and a 2nd-order filter circuit are realized by a 1 st-order transfer function and a 2nd-order transfer function, respectively.

The 2nd-order filter circuit, based on the Biquad method, can be normally realized by an RC active filter circuit consisting of op-amps (operational-amplifiers), resistors (Rs), and capacitors (Cs), or a gm-C filter consisting of OTAs (Operational Transconductance Amplifiers) and capacitors (Cs), but it cannot necessarily be realized only by passive elements such as inductors (Ls), resistors (Rs), and capacitors (Cs).

Note that, since an op-amp has a voltage input and a voltage output, the relationship between the input and the output is defined as a voltage gain. Since an OTA has a voltage input and a current output, the relationship between the input and the output is defined as a transconductance which is expressed as gm. Further, in a gm-C filter, a capacitor C is utilized as an equivalent inductance L according to the gyrator theory.

As an embodiment of the present invention, a specific example in which a 3rd-order inverse Chebychev filter is realized will be described first.

Figure 3:
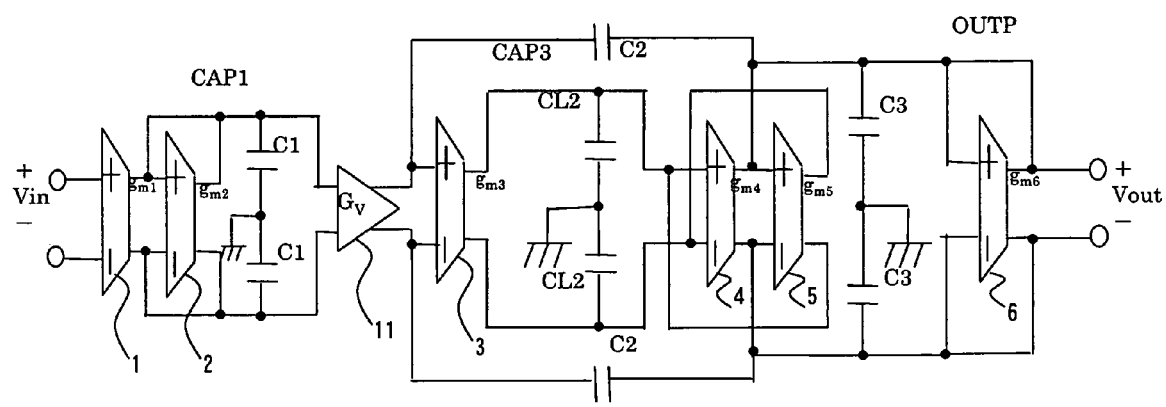
FIG. 3 is a diagram illustrating a circuit realized by gm-C filters of a 3rd-order inverse Chebychev LPF with an inserted voltage amplifier having a voltage gain of Gv of the present invention.

FIG. 3 is a diagram illustrating the embodiment of the present invention adapted to a 3rd-order inverse Chebychev filter. An inverse Chebychev LPF has a maximally flat passband compared to a Butterworth LPF. Having transmission zeros in the stopband, the inverse Chebychev LPF has an equi-ripple, and has its attenuation characteristic limited. However, the inverse Chebychev LPF is used as a channel selection filter in a receiver because a steep attenuation characteristic is able to be obtained, and is suited for data transmission because it has an in-band phase characteristic superior than that of a Butterworth LPF.

However, since there has been no appropriate text that describes the design technique of inverse Chebychev filters, not many designers in the field are familiar with them. For reference, the design technique of a 3rd-order inverse Chebychev LPF will be explained in detail.

[The General Concept of the Design Approach]

First, an inverse transformation procedure will be described. In the "inverse Chebychev filter", there is provided an adjective "inverse". This "inverse" corresponds to the inverse of an inverse function. We are familiar as inverse functions with an exponential function and a logarithmic function, and a square and a √ (square root). The relationship between a voltage and a current in a bipolar transistor or a MOS transistor is such an inverse function. However, a function or an inverse function is not always used clearly with a discrimination of the difference between them.

It is necessary to discriminate a Chebychev filter from an inverse Chebychev filter clearly. Here, "inverse" means that the relationship between the passband and the stopband is functionally inversed.

Assuming that the transfer function of a Chebychev filter is $T_C(s)$, the following is derived in a first step:

$$|T_{IC}(j\omega)|^2 = 1 - |T_C(j\omega)|^2 \quad (1)$$

and the following is derived in a second step:

$$|H(j\omega)|^2 = |T_{IC}(j/\omega)|^2 \quad (2)$$

In a third step, the transfer function H(s) of the inverse Chebychev filter is derived from the equation (2).

The equation (1) corresponds to the operation of replacing the passband with the stopband, and the equation (2) corresponds to the operation of exchanging the frequency axes.

In other words, the transformation from LPF to HPF (or from HPF to LPF) is carried out by the replacement of the passband with the stopband, and the restoration from HPF to LPF (or from LPF to HPF) is carried out by the exchange of the frequency axes from $\omega$ to $1/\omega$.

As a result, the equiripple characteristic in the passband moves to the stopband, and the characteristic of monotonous attenuation along with a frequency $\omega$ in the stopband changes to the flat characteristic of the passband.

A specific example will be described. First, a 3rd-order Chebychev LPF will be described in the below.

Figure 4:
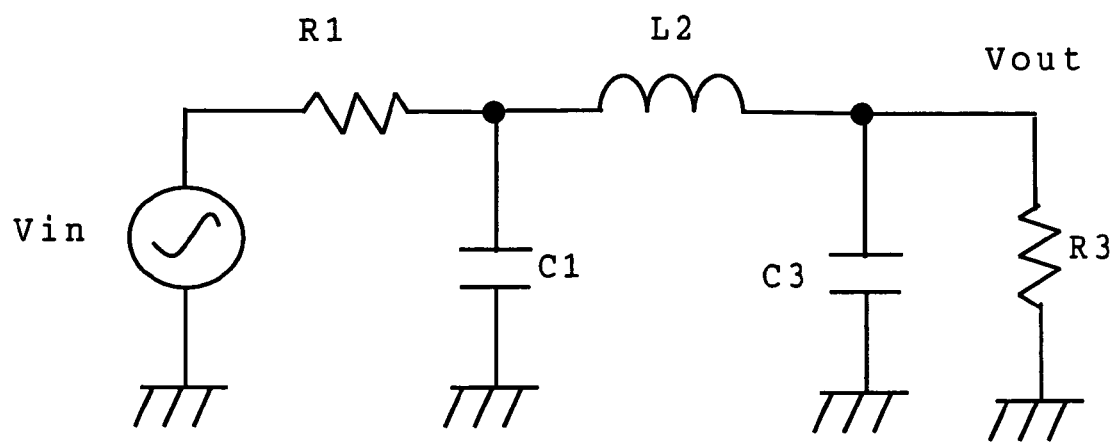
FIG. 4 is a diagram showing the circuit of a 3rd-order LCR ladder LPF for explaining the present invention.

The transfer function TC(s) of a 3rd-order Chebychev LC ladder LPF shown in FIG. 4 is given as follows, if R1=R3=1, C1=C2=c, and L2=l:

$$T_c(s) = \frac{2}{(cs+1)(cls^2+ls+2)} = \frac{2}{c^2ls^3 + 2cls^2 + (2c+l)s + 2} \quad (3)$$

Note that the numerator is set to 2 so that $T_C(0)=1$.

The square of the amplitude characteristic is given:

$$|T_c(j\omega)|^2 = \frac{4}{(2-2cl\omega^2)^2 + \{(2c+l)\omega - c^2l\omega^3\}^2} \quad (4)$$

When the passband is replaced with the stopband, the following is given:

$$1 - |T_c(j\omega)|^2 = \frac{\{(2c-l)\omega - c^2l\omega^3\}^2}{(2-2cl\omega^2)^2 + \{(2c+l)\omega - c^2l\omega^3\}^2} \quad (5)$$

Further, when the frequency axes are exchanged, the following is given:

$$1 - |T_c(j/\omega)|^2 = \frac{\{(2c-l)\omega - c^2l\}^2}{(2\omega^3 - 2cl\omega)^2 + \{(2c+l)\omega^2 - c^2\}^2} \quad (6)$$

Note the relationship between the numerator and the second term of the denominator.

The second term of the denominator in the equation (6):

$$\{(2c+l)\omega^2 - c^2l\}^2$$

and the numerator:

$$\{(2c-l)\omega^2 - c^2l\}^2$$

They are settled by:

$$\{(2c\mp l)\omega^2 - c^2l\}^2$$

Looking at each coefficient of $\omega^n$, since the numerator has − and the denominator has +, the coefficient of $\omega^n$ in the numerator is smaller than the coefficient of $\omega^n$ in the denominator.

Accordingly, the transfer function H(s) of the 3rd-order Chebychev LPF is given as follows:

$$H(s) = \frac{(2c-l)s^2 + c^2l}{2s^3 + (2c+l)s^2 + 2cls + c^2l} = \frac{(2c-l)s^2 + c^2l}{(s+c)(2s^2 + ls + cl)} \quad (7)$$

The equation (3) may also be applied to a 3rd-order Butterworth LPF. Further, if √ (the square root) is applied in the (6), the amplitude characteristic of the 3rd-order inverse Chebychev LPF indicated by the equation (7) can be obtained.

From the equation (7), the denominator is realized by a 1st-order LPF and a 2nd-order LPF, while the numerator is realized by an elliptic capacitor.

Therefore, the 3rd-order inverse Chebychev LPF is realized by using a 3rd-order elliptic gm-C filter, and the number of OTAs (Operational Transconductance Amplifier) necessary is determined by the order of the filter as before.

In order to derive the transfer function H(s) of the inverse Chebychev filter from the transfer function $T_c(s)$ of a Chebychev filter, the coefficients are exchanged in order in the denominator e.g. exchanging the highest-order coefficient and the lowest-order coefficient (constant).

The numerator is realized by adding a term $as^2+b$ that realizes an elliptic characteristic.

APPLICATION EXAMPLE

Figure 5:
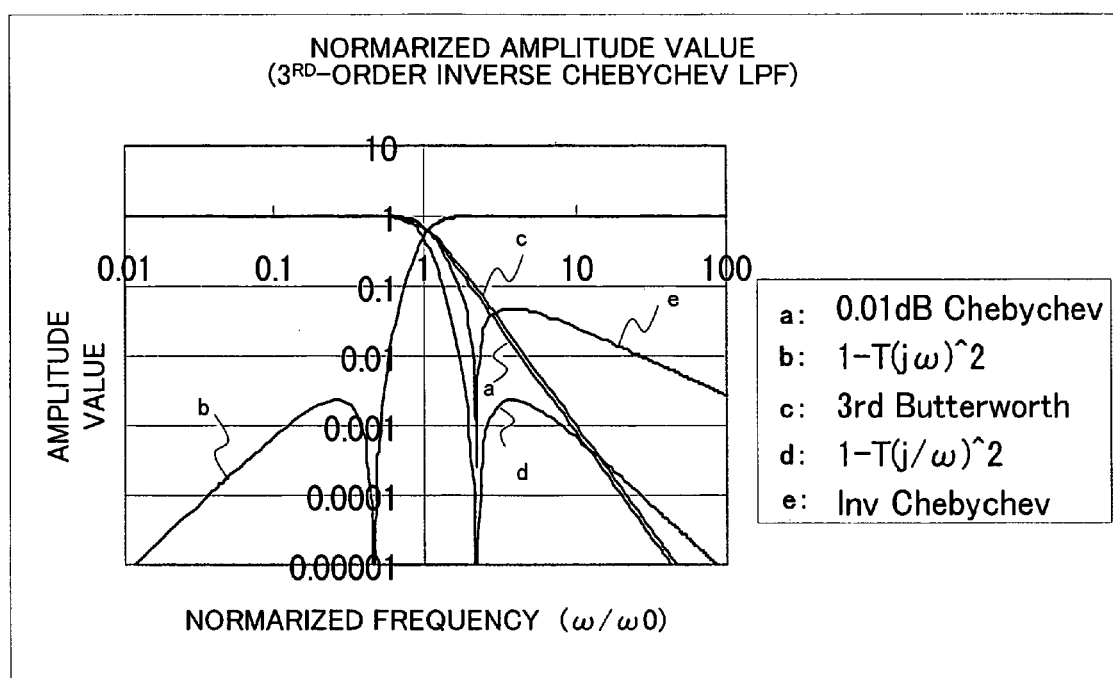
FIG. 5 is a drawing illustrating the characteristic of the 3rd-order inverse Chebychev LPF for explaining the present invention.

As an example, the constants of the normalized 0.01 dB ripple 3rd-order Chebychev LPF are substituted such that R1=R3=1 Ω, C1=C3=c=1.1811F, and L2=l=1.8214H. The graph of the normalized amplitude value in the frequency response of the 3rd-order Chebychev LPF is shown in FIG. 5.

(0.01 dB ripple 3rd-order Chebychev LPF:

$$T_c(s) = \frac{2}{2.540848s^3 + 4.302511s^2 + 4.1836s + 2}$$

)

Further, the passband is replaced by the stopband $(1-|T(j\omega)|^2)$, and the frequency axes are exchanged $(1-|T(j/\omega)|^2)$. Finally, when the square root ($\sqrt{}$) is applied, the amplitude characteristic of the 3rd-order inverse Chebychev LPF is obtained.

(3rd-order inverse Chebychev LPF:

$$H(s) = \frac{0.540692454 s + 2.540848}{2s^3 + 4.1836 s^2 + 4.302511\ s + 2.540848}$$

)

This process can be traced back in FIG. 5. The amplitude characteristic (a) of the 0.01 dB ripple 3rd-order Chebychev LPF and the amplitude characteristic (c) of a 3rd-order Butterworth LPF approximately overlap, however, the equiripple characteristic in the stopband does not attenuate up to 30 dB in the amplitude characteristic (e) of the inverse Chebychev LPF. The in-band equiripple characteristic of the Chebychev LPF is 3 dB at maximum.

Therefore, the equiripple characteristic in the stopband of the inverse Chebychev LPF is less than or equal to −10.666 dB, and a large attenuation amount with an equiripple characteristic in the stopband can be obtained while maintaining an excellent flat characteristic in the passband.

ANOTHER APPLICATION EXAMPLE

Further, the transfer function of a 3rd-order inverse Chebychev LPF whose equiripple characteristic in the stopband is improved to 40 dB is derived in case of n=3 (3rd order), as follows:

$$a = \frac{1}{n}\sinh^{-1}\left(\frac{1}{\varepsilon}\right) \tag{8}$$

where $$\epsilon = \sqrt{10^{\alpha_{max}/10} - 1} \tag{9}$$

where $\alpha_{max}$ (<3 dB) in $\sqrt{}$ indicates the equiripple value.

$$\sin h^{-1}(\chi) = \ln(\chi + \sqrt{\chi^2 + 1}) \tag{10}$$

$$\cos h^{-1}(\chi) = \ln(\chi + \sqrt{\chi^2 - 1}) \tag{11}$$

The root is derived as follows:

$$-\alpha_K = \sin h(a) \cdot \sin(\Phi_K) \tag{12}$$

$$\pm \beta_K = \cos h(a) \cdot \cos(\Phi_K) \tag{13}$$

where:

$$\phi_k = \frac{2k+1}{n}\frac{\pi}{2} \quad k = 0, 1, \ldots, 2n-1 \tag{14}$$

In order to obtain an equiripple attenuation characteristic of −40 dB with an inverse Chebychev LPF, $\alpha$max=0.0004342 dB and $\epsilon$=0.01. From the equation (1), a=1.766142155 and sin h(a)=2.83862838728775. Further, $\Phi$K=30°, 90°, 150°, and the following is given:

$$p_1, p_2 = -1.41931419364388 \pm j2.60640717096099$$

$$p_3 = -2.83862838728775$$

The transfer function of a 0.0004342 dB ripple 3rd-order Chebychev LPF is given as follows:

$$T_c(s) = \frac{25.0021}{(s+2.83862839)(s^2 + 2.83862839 s + 8.80781112)} \tag{15}$$

The denominator in the expression (15) is expanded as follows:

$$T_c(s) = \frac{25.0021}{s^3 + 5.677257\ 14.42726 s^2 + 16.86562 s + 25.0021} \tag{16}$$

Note that the cut-off frequency $\omega_{hp}$(hp:half-power) is given:

$$\omega_{hp} = \cosh\left\{\frac{1}{n}\cosh^{-1}\left(\frac{1}{e}\right)\right\} \tag{17}$$

In the case of the 0.0004342 dB ripple 3rd-order Chebychev LPF, the cut-off frequency $\omega_{hp}$=3.00957237 holds. When the cut-off frequency $\omega_{hp}$=1, the transfer function of the 0.0004342 dB ripple 3rd-order Chebychev LPF is given as the follows:

$$T_c(s) = \frac{0.917196}{s^3 + 1.8864 s^2 + 1.862056 s + 0.917196} \tag{18}$$

When the denominator in the expression (18) is factorized, the transfer function is given as follows:

$$T_c(s) = \frac{0.917196}{(s+0.9432)(s^2 + 0.9432 s + 0.97243)} \tag{19}$$

Comparing the coefficients of the equations (3) and (18), c=1.060220526 and l=1.939882512 hold.

When these values are substituted in the equation (7), the transfer function H(s) of the 3rd-order inverse Chebychev LPF is given as follows:

$$H(s) = \frac{0.180559 s^2 + 2.180559}{2s^3 + 4.060324 s^2 + 4.113407 s + 2.180559} \tag{20}$$

$$= \frac{0.090279 s^2 + 1.09028}{s^3 + 2.030162 s^2 + 2.056703 s + 1.09028}$$

The factorization of the denominator in the expression (20) gives:

$$H(s) = \frac{0.180559 s^2 + 2.180559}{(s+1.060221)(2 s^2 + 1.939883 s + 2.056703)} \tag{21}$$

$$= \frac{0.090279 s^2 + 1.09028}{(s+1.060221)(s^2 + 0.969941 s + 1.028352)}$$

Figure 6:
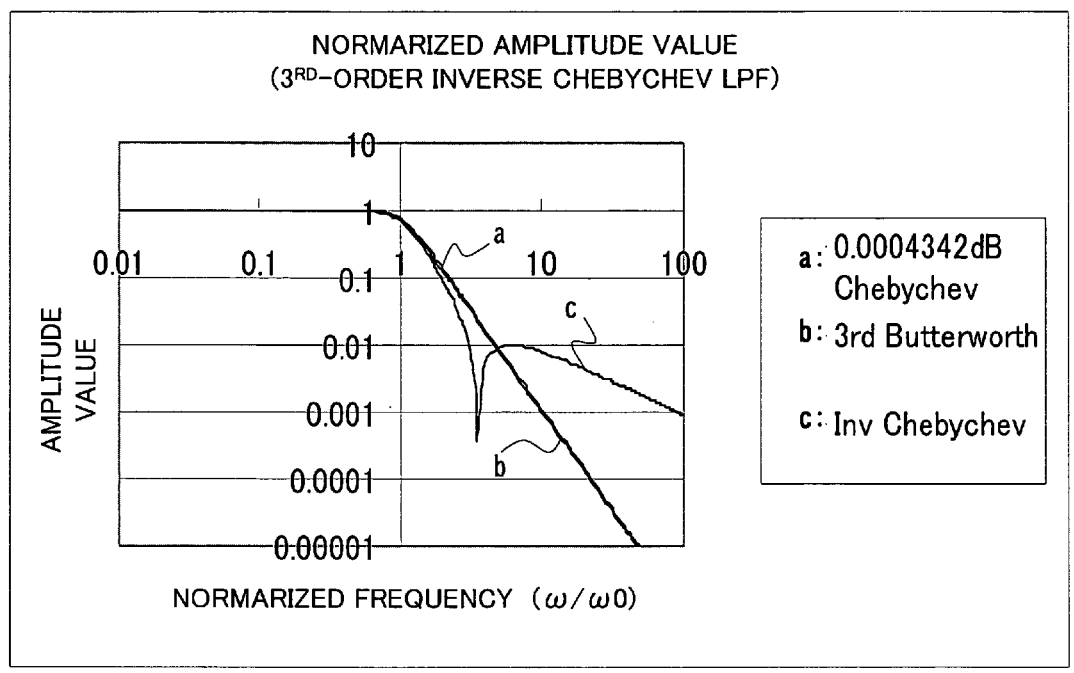
FIG. 6 is a drawing illustrating the normalized amplitude characteristic of the 3rd-order inverse Chebychev LPF for explaining the present invention.

In FIG. 6, the amplitude characteristic (c) of the 3rd-order inverse Chebychev LPF is shown along with that (a) of the original 0.0004342 dB ripple 3rd-order Chebychev LPF and that (b) of the 3rd-order Butterworth LPF. While the transmission zero of the 3rd-order inverse Chebychev LPF is ω=2.17 (attenuation band ripple height: −26.4 dB) in case of the ripple characteristic of the original 3rd-order Chebychev LPF shown in FIG. 5 being 0.01 dB, the transmission zero of the 3rd-order inverse Chebychev LPF is ω=3.47(attenuation band ripple height: −40.0 dB) in case of the ripple characteristic of the original 3rd-order Chebychev LPF being 0.0004342 dB.

Figure 7:
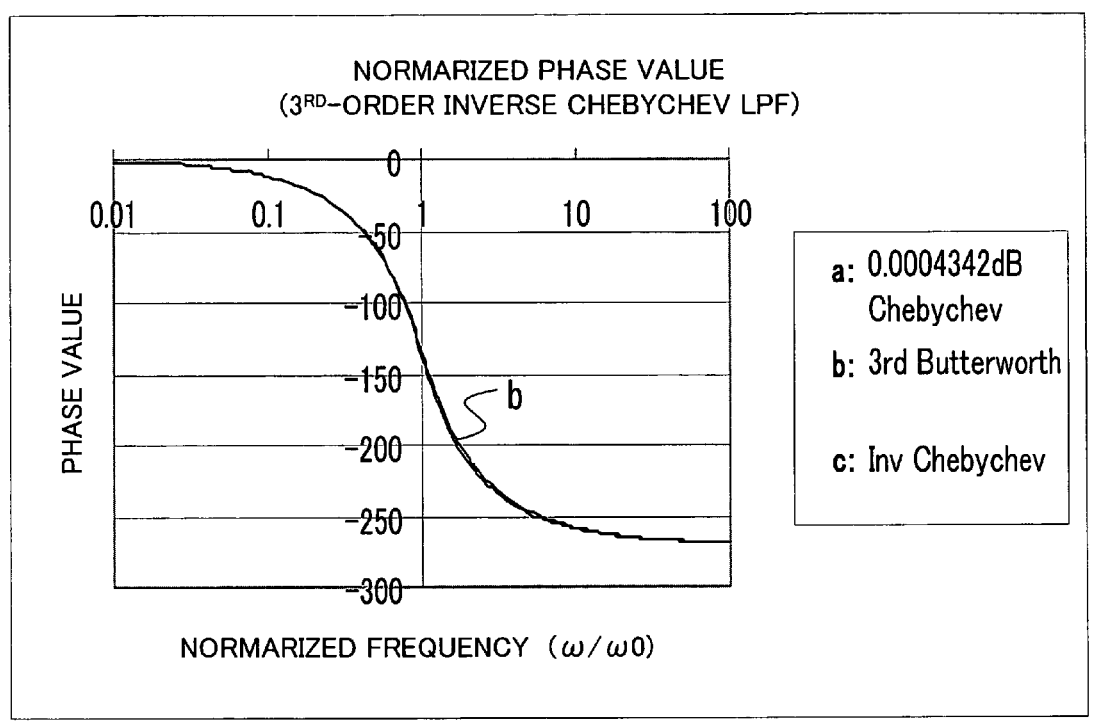
FIG. 7 is a drawing illustrating the normalized phase characteristic of the 3rd-order inverse Chebychev LPF for explaining the present invention.

Further, the phase characteristic (c) of the 3rd-order inverse Chebychev LPF is shown in FIG. 7 along with that (a) of the original 0.0004342 dB ripple 3rd-order Chebychev LPF and that (b) of the 3rd-order Butterworth LPF. The phase characteristic of the 3rd-order inverse Chebychev LPF is approximately the same as the phase characteristic of the original 0.0004342 dB ripple 3rd-order Chebychev LPF and the phase characteristic of the 3rd-order Butterworth LPF.

DESIGN EXAMPLE

Now we finally return to the case of the 3rd-order Chebychev gm-C LPF shown in FIG. 3. Because a single-end OTA has rather a high secondary distortion and an unsatisfactory signal amplitude, the gm-C LPF in FIG. 3 is fully differential. The gm-C filter, which comprises OTAs and capacitors, performs an integrating operation by charging the capacitor with a current which is proportionate to an input voltage to realize a filter characteristic. In the example shown in FIG. 3, a 1st-order gm-C LPF comprises an OTA 1 which differentially receives a voltage Vin, and an OTA2 which has differential inputs connected to the connection points between differential outputs of the OTA1 and one ends of two capacitors $C_1$ whose other ends are grounded, and has differential outputs connected to the other ends of the two capacitors C1 respectively. A 2nd-order gm-C LPF comprises an OTA 3 which has differential inputs connected to the connection points between differential outputs of an amplifier (gain Gv) 11 and one ends of two capacitors $C_{L2}$ whose other ends are grounded, and has differential outputs connected to the other ends of the two capacitors $C_{L2}$, respectively, an OTA 4 which has differential inputs connected to the other ends of the capacitors $C_{L2}$, and an OTA 5 which has differential inputs connected to the connection points between differential outputs of the OTA4 and one ends of two capacitors $C_3$ whose other ends are grounded, and has differential outputs connected to the other ends of the two capacitors $C_3$, respectively. The differential outputs of the OTA 5 are cross-connected to the differential inputs of the OTA 4. The 2nd-order gm-C LPF further comprises an OTA 6 which has differential inputs connected to the other ends of two capacitors $C_3$ and has differential outputs connected to the other ends of the two capacitors $C_3$. The differential outputs of the OTA 4 are feedback-connected to the connection points between the differential inputs of the OTA 3 and the differential outputs of the amplifier via the capacitors $C_2$. The mutual conductances of the OTA1 through the OTA 6 are set to $g_{m1}$ through $g_{m6}$.

In the preceding stage of the amplifiers of the 3rd-order inverse Chebychev gm-C LPF shown in FIG. 3, there is provided a 1st-order gm-C LPF whose transfer function $H_1(s)$ is given as follows:

$$H_1(s) = \frac{V_{out}}{V_{in}} = \frac{\frac{2g_{m1}}{C_1}}{s + \frac{2g_{m2}}{C_1}} \quad (22)$$

In the succeeding stage of the amplifiers of the 3rd-order inverse Chebychev gm-C LPF shown in FIG. 3, there is provided a 2nd-order elliptic gm-C LPF whose transfer function $H_2(s)$ is given as follows:

$$H_2(s) = \frac{V_{out}}{V_{in}} = \frac{\frac{C_2}{C_2+C_3}s^2 + \frac{4g_{m3}g_{m4}}{C_{L2}(C_2+C_3)}}{s^2 + s\frac{2g_{m6}}{C_2+C_3} + \frac{4g_{m4}g_{m6}}{C_{L2}(C_2+C_3)}} \quad (23)$$

Therefore, the transfer function defined by the product of $H_1(s)$ and $H_2(s)$ is given as follows:

$$H(s) = H_1(s) \cdot H_2(s) = \frac{\frac{2g_{m1}}{C_1}}{2 + \frac{2g_{m2}}{C_1}} \cdot \frac{\frac{C_2}{C_2+C_3}s^2 + \frac{4g_{m3}g_{m4}}{C_{L2}(C_2+C_3)}}{s^2 + s\frac{2g_{m6}}{C_2+C_3} + \frac{4g_{m4}g_{m6}}{C_{L2}(C_2+C_3)}} \quad (24)$$

$$= \frac{\frac{2g_{m1}C_2}{C_1(C_2+C_3)}s^2 + \frac{8g_{m1}g_{m3}g_{m4}}{C_1C_{L2}(C_2+C_3)}}{s^2 + \left(\frac{2g_{m2}}{C_1} + \frac{2g_{m6}}{C_2+C_3}\right)s^2 + \left\{\frac{4g_{m2}g_{m6}}{C_1(C_2+C_3)} + \frac{4g_{m4}g_{m6}}{C_{L2}(C_2+C_3)}\right\}s + \frac{8g_{m2}g_{m4}g_{m6}}{C_1C_{L2}(C_2+C_3)}}$$

When $g_{m1}=g_{m2}=g_{m3}=g_{m4}=g_{m5}=g_{m6}=g_m$, the following equation holds:

$$H(s) = \frac{\frac{2g_m C_2}{C_1(C_2+C_3)}s^2 + \frac{8g_m^3}{C_1C_{L2}(C_2+C_3)}}{s^3 + \left(\frac{2g_m}{C_1} + \frac{2g_m}{C_2+C_3}\right)s^2 + \left\{\frac{4g_m^2}{C_1(C_2+C_3)} + \frac{4g_m^2}{C_{L2}(C_2+C_3)}\right\}s + \frac{8g_m^3}{C_1C_{L2}(C_2+C_3)}} \quad (25)$$

$$= \frac{\frac{C_2C_{L2}}{4g_m^2}s^2 + 1}{\frac{C_1C_{L2}(C_2+C_3)}{8g_m^3}s^3 + \left\{\frac{C_1C_{L2}}{4g_m^2} + \frac{C_{L2}(C_2+C_3)}{4g_m^2}\right\}s^2 + \left(\frac{C_1}{2g_m} + \frac{C_{L2}}{2g_m}\right)s + 1}$$

Here, the coefficients are compared with the ones in the equation (21) and the constants are determined.

The transfer function H(s) of the 3rd-order inverse Chebychev LPF with an attenuation band of −40 dB is given as follows with the denominator and numerator factorized:

$$H(s) = \frac{0.090279 s^2 + 1.09028}{(s+1.060221)(s^2 + 0.969941 s + 1.028352)} \quad (26)$$

This transfer function is decomposed into a 1st-order LPF:

$$H_1(s) = \frac{1.060221}{s + 1.060221} \quad (27)$$

and a 2nd-order elliptic *LPF*:

$$H_2(s) = \frac{0.08515111 s^2 + 1.02835164}{s^2 + 0.969941 s + 1.028352} \quad (28)$$

When the coefficients of the equations (22) and (27) are compared:

$$\frac{2g_{m1}}{C_1} = \frac{2g_{m2}}{C_1} = 1.060221 \quad (29)$$

Therefore, $g_{m1}=g_{m2}$.

This stands to reason because the numerator in the equation (27) is set to 1.060221, equal to the zero-order coefficient of the denominator. In other words, $H_1(0)=1$ holds.

And $H_2(0)=1$ holds. Further, the following equations hold:

$$\frac{2g_{m6}}{C_2+C_3} = 0.969941 \quad (30)$$

$$\frac{4g_{m4}g_{m5}}{C_{s2}(C_2+C_3)} = 1.028352 \quad (31)$$

$$\frac{C_2}{C_2+C_3} = 0.08515111 \quad (32)$$

$$\frac{4g_{m3}g_{m4}}{C_{s2}(C_2+C_3)} = 1.028352 \quad (33)$$

Here, when $g_{m3}=g_{m4}=g_{m5}=g_{m6}=5$ μS, and $f_c=1.920$ MHz, the following equation holds from the equation (29):

$$C_1 = \frac{10\mu}{1.060221 \times 2\pi \times 1.920 M} = 0.7818483 \text{ [pF]} \quad (34)$$

The equation (31) is equal to the equation (33), and when the equation (30) is substituted into them:

$$C_{L2} = \frac{10\mu}{(1.028352/0.969941) \times 2\pi \times 1.920 M} = 0.781848169 \text{ [pF]} \quad (35)$$

From the equation (30):

$$C_2 + C_3 = \frac{10\mu}{0.969941 \times 2\pi \times 1.920 M} = 0.85462105 \text{ [pF]} \quad (36)$$

From the equation (32), since $C_2=0.093076693 C_3$, the following equations are given:

$$C_3 = 0.7818483 \text{ [pF]} \quad (37)$$

$$C_2 = 0.07277193 \text{ [pF]} \quad (38)$$

In the 3rd-order gm-C LPF shown in FIG. 3, if the OTAs are replaced by voltage controlled current sources (VCCSs) which are ideal OTAs, using the constants calculated above, the 3rd-order gm-C LPF is able to be easily simulated by SPICE. Here, voltage controlled voltage sources (VCVSs) are inserted between the stages. Note that when VCCSs are connected as $gm_1$ and $gm_2$, the isolation that VCVSs offer cannot be obtained.

Note that all the capacitance values are equal ($C_1=C_{L2}=C_3$) in the case of the 3rd-order inverse Chebychev LPF shown here. Further, the denominator of the equation (28) has a small Q value, Q=1.0455.

Figure 8:
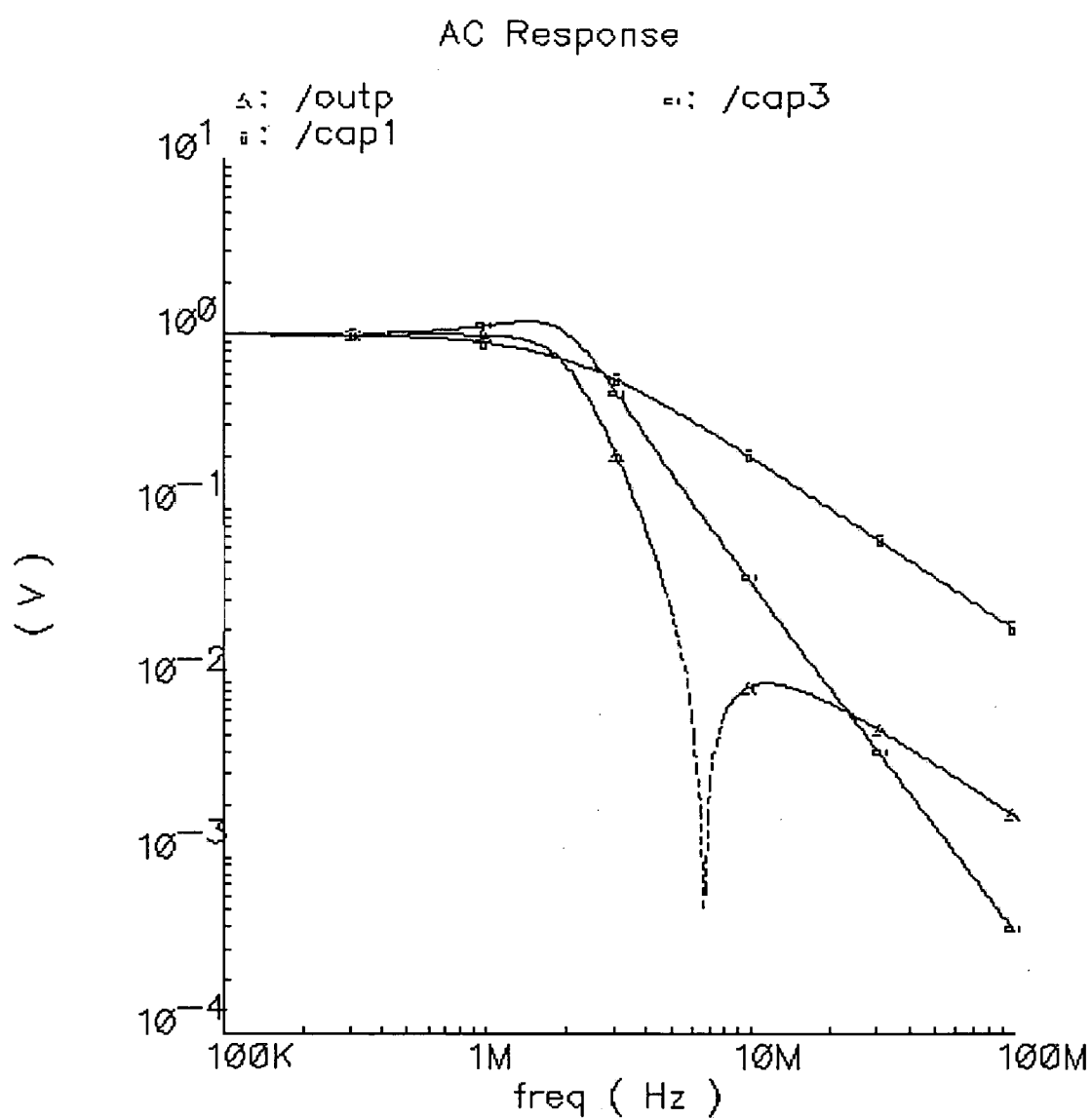
FIG. 8 is a drawing illustrating the simulation values of the amplitude characteristic of the 3rd-order inverse Chebychev LPF of the present invention.

In FIG. 8, the frequency response obtained is shown. In FIG. 8, even when the voltage gain GV is varied from 1, the level of cap1 is unchanged, but the levels of cap3 and outp change on a log scale by the amount of the voltage gain GV. In other words, the 3rd-order inverse Chebychev LPF is realized by the 1st-order gm-C LPF, the amplifiers, and the 2nd-order elliptic gm-C LPF.

Embodiment 2

Next, how a 5th-order inverse Chebychev gm-C is designed will be described.

The transfer function H(s) of the 5th-order inverse Chebychev LPF having an attenuation band of 40 dB is given as follows:

$$H(s) = \frac{(0.3463405 s^2 + 1)(0.13231949 s^2 + 1)}{(1 + 0.78555 s)(1 + 0.485496 s + 0.963449465 s^2)} \quad (39)$$

$$(1 + 1.271046 s + 0.749386387 s^2)$$

Figure 9:
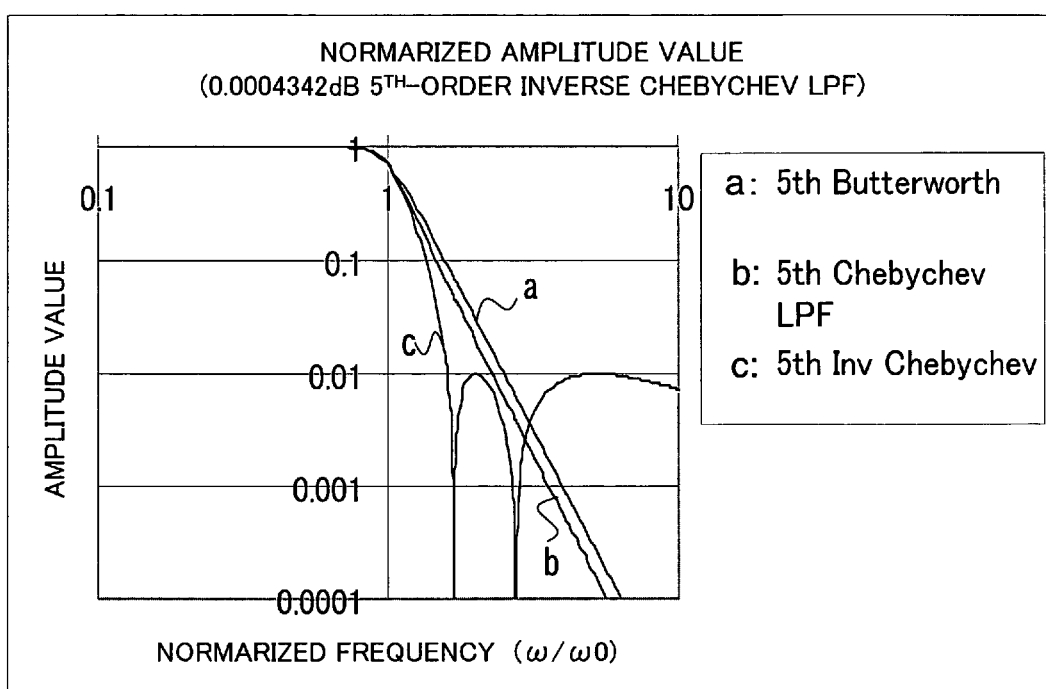
FIG. 9 is a drawing illustrating the normalized amplitude characteristic of a 5th-order inverse Chebychev LPF for explaining the present invention.
Figure 10:
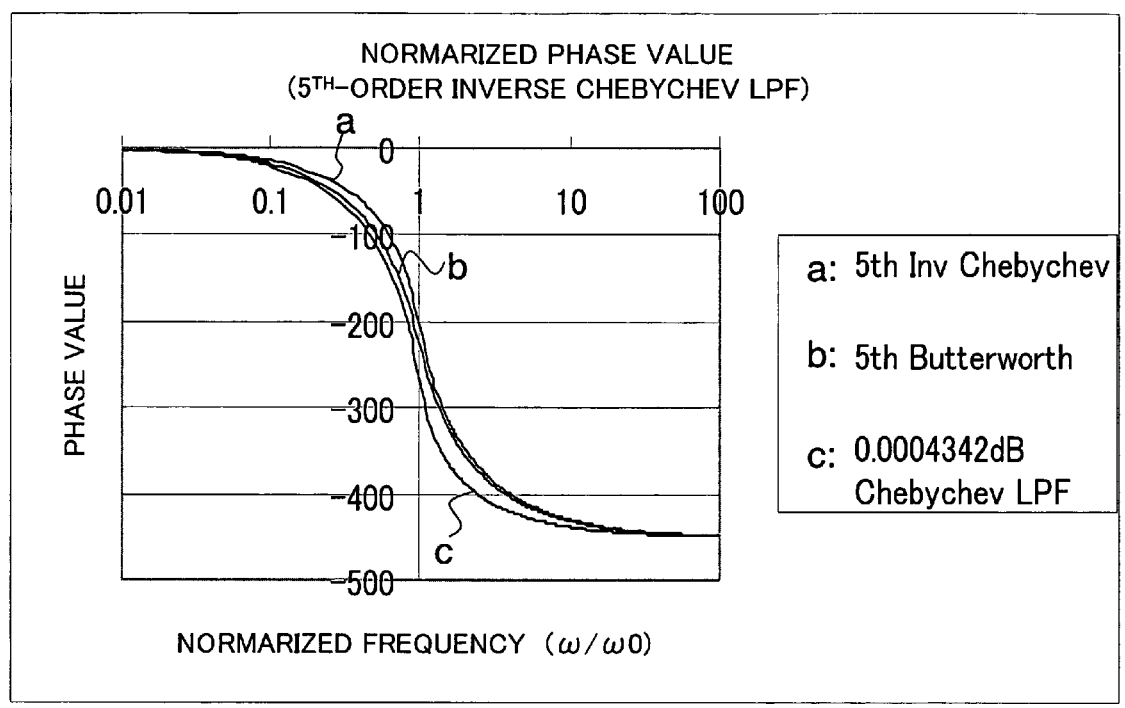
FIG. 10 is a drawing illustrating the normalized phase characteristic of the 5th-order inverse Chebychev LPF for explaining the present invention.

The frequency response of this 5th-order inverse Chebychev LPF having an attenuation band of 40 dB is shown in FIG. 9 (characteristic c in FIG. 9), and the phase characteristic is shown in FIG. 10 (characteristic a in FIG. 10).

Here, when H(s) is decomposed into the products of transfer functions of 1st-order LPF and 2nd-order LPF respectively:

$$H(s) = H_1(s) \cdot H_2(s) \cdot H_3(s) \quad (40)$$

$H_1(s)$, $H_2(s)$, and $H_3(s)$ are given as follows:

$$H_1(s) = \frac{1.272993444}{s + 1.272993444} \quad (41)$$

$$H_2(s) = \frac{0.359479674 s^2 + 1.037937158}{s^2 + 0.50914338 s + 1.037937158} \quad (42)$$

$$H_3(s) = \frac{0.17657044 7s^2 + 1.334425094}{s^2 + 1.696115678 s + 1.334425094} \quad (43)$$

The 5th-order inverse Chebychev gm-C LPF is realized by a 1st-order gm-C LPF and two 2nd-order gm-C LPFs. All $g_m$ are equal and when $g_m=5$ μS and $f_c=1.92$ MHz, the capacitance value of each filter is as follows. For the first stage 1st-order gm-C LPF, from:

$$\frac{2g_m}{C_1} = 1.272993444 \quad (44)$$

$C_1$ is given as follows:

$$C_1 = \frac{10\mu}{1.272993444 \times 2\pi \times 1.92 M} = 0.6511675 \text{ [pF]} \quad (45)$$

For the next stage 2nd-order gm-C LPF:

$$\frac{2g_m}{C_2+C_3} = 0.503914338 \quad (46)$$

$$\frac{C_2}{C_2+C_3} = 0.359479674 \quad (47)$$

$$\frac{4g_m^2}{C_{L2}(C_2+C_3)} = 1.037937158 \quad (48)$$

The equation (46) is substituted into the equation (48):

$$C_{L2} = \frac{10\mu}{(1.037937158/0.503914338) \times 2\pi \times 1.92M} \quad (49)$$
$$= 0.4024431676 \text{ [pF]}$$

From the equation (46):

$$C_2 + C_3 = \frac{10\mu}{0.503914338 \times 2\pi \times 1.92M} = 1.644985929 \text{ [pF]} \quad (50)$$

From the equation (47), since $C_2=0.561230704C_3$, $C_2$ and $C_3$ are as follows:

$$C_2 = 0.5913390053 \text{ [pF]} \quad (51)$$
$$C_3 = 1.053646923 \text{ [pF]} \quad (52)$$

Similarly, for the last stage 2nd-order gm-C LPF:

$$\frac{2g_m}{C_4+C_5} = 1.696115678 \quad (53)$$

$$\frac{C_4}{C_4+C_5} = 0.176570447 \quad (54)$$

$$\frac{4g_m^2}{C_{L4}(C_4+C_5)} = 1.334425094 \quad (55)$$

The equation (53) is substituted into the equation (55):

$$C_{L4} = \frac{10\mu}{(1.334425094/1.696115678) \times 2\pi \times 1.92M} \quad (56)$$
$$= 1.053610697 \text{ [pF]}$$

From the equation (53):

$$C_4 + C_5 = \frac{10\mu}{1.696115678 \times 2\pi \times 1.92M} \quad (57)$$
$$= 0.4887237386 \text{ [pF]}$$

Since $C_4=0.214432972C_5$ from the equation (47), $C_4$ and $C_5$ are as follows:

$$C_4 = 0.086294168 \text{ [pF]} \quad (58)$$
$$C_5 = 0.402429569 \text{ [pF]} \quad (59)$$

Figure 11:
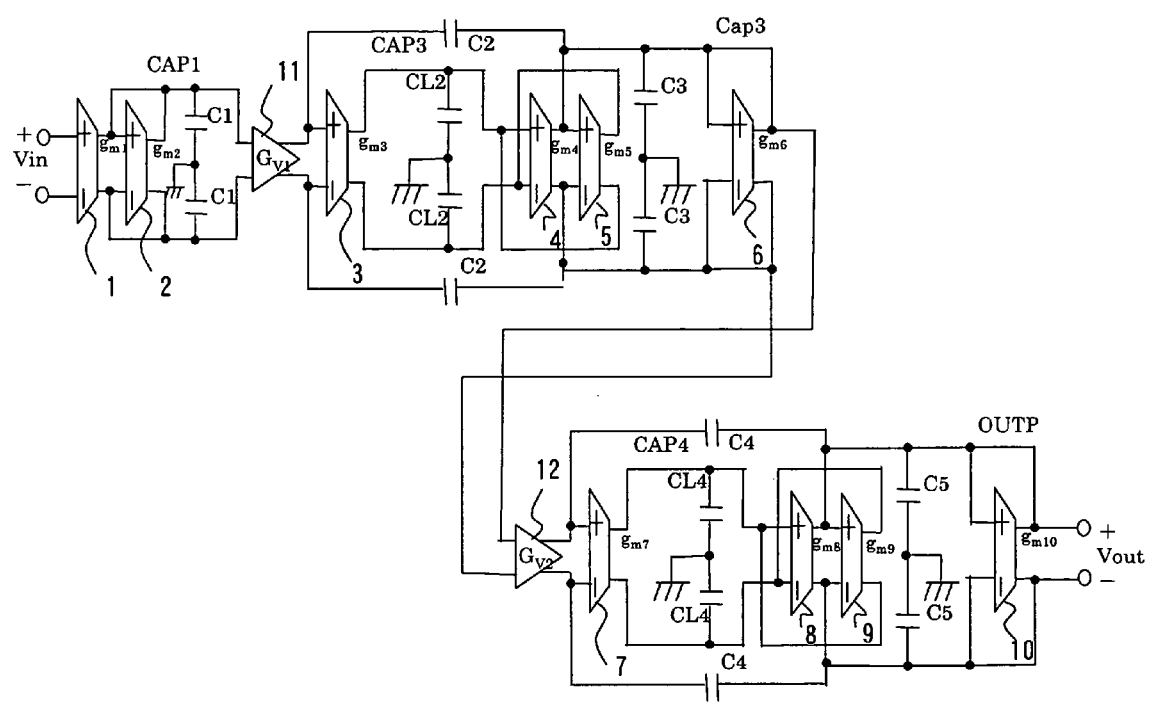
FIG. 11 is a diagram illustrating a circuit realized by gm-C filters of the 5th-order inverse Chebychev LPF with two inserted voltage amplifiers having voltage gains of Gv1 and Gv2, respectively, of the present invention.
Figure 12:
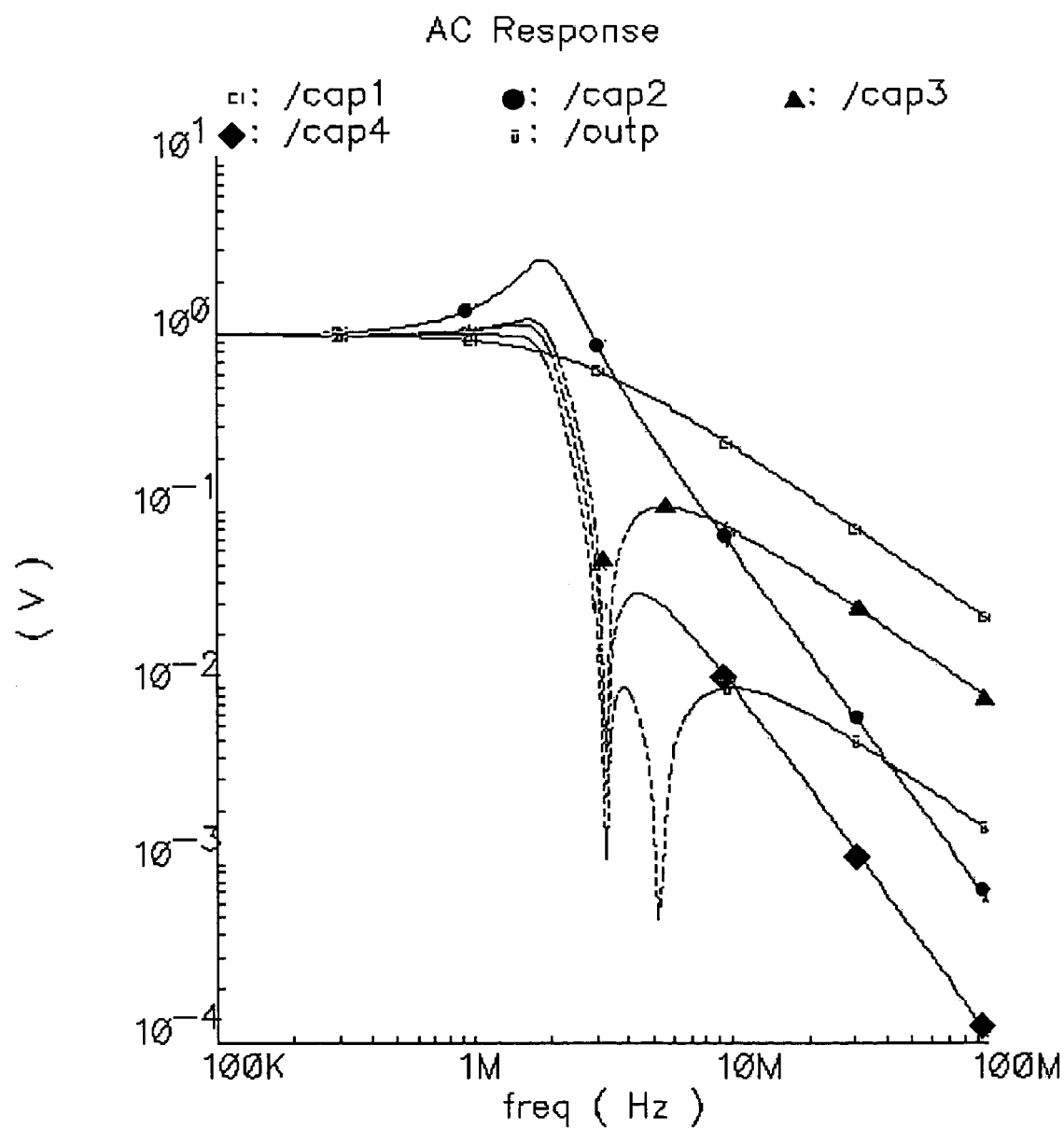
FIG. 12 is a drawing illustrating the simulation values of the amplitude characteristic of the 5th-order inverse Chebychev LPF of the present invention.

FIG. 11 shows the configuration of the 5th-order inverse Chebychev gm-C LPF in which two amplifiers (VCVSs) with voltage gains of $G_{V1}$ and $G_{V2}$ are inserted between the stages of the 1st-order gm-C LPF and the two 2nd-order gm-C LPFs. As in the case of the 3rd-order inverse Chebychev gm-C LPF, the frequency response is unchanged regardless of how the voltage gains $G_{V1}$ and $G_{V2}$ are set. The frequency response in case of $G_{V1}=G_{V2}=1$ is shown in FIG. 12. The level (×2.7) at the cap2 terminal is notable.

The transfer functions are exchanged between the two 2nd-order LPFs from the equation (39). From $$H_2(s) = \frac{0.1373393155s^2 + 1.037937158}{s^2 + 0.503914338s + 1.037937158} \quad (42)'$$

$$H_3(s) = \frac{0.4621654545s^2 + 1.334425094}{s^2 + 1.696115678s + 1.334425094} \quad (43)'$$

are derived $C_1$=0.6511675[pF], $C_{L2}$=0.4024431676[pF], $C_2$=0.2259212406[pF], $C_3$=1.419064688[pF], $C_4$=0.2258712285[pF], $C_{L4}$=1.053610697[pF], and $C_5$=0.26285251[pF].

Figure 13:
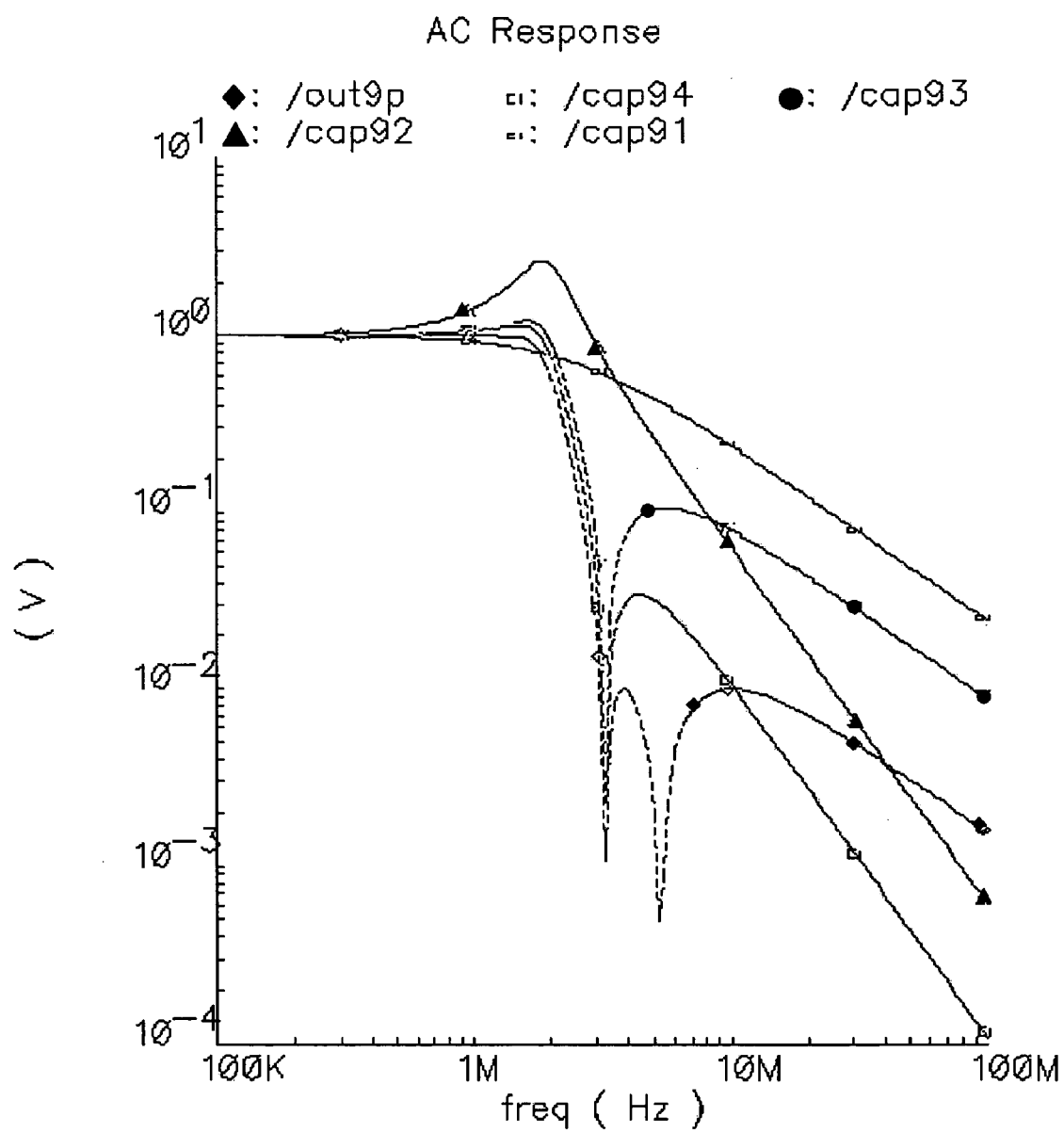
FIG. 13 is a drawing illustrating the simulation values of the amplitude characteristic of another 5th-order inverse Chebychev LPF of the present invention.

In this case, the frequency response incase of $G_{V1}=G_{V2}=1$ is shown in FIG. 13, which is identical to FIG. 12.

As evident from the circuit diagram in FIG. 11 and the frequency response graph in FIG. 12, the 5th-order inverse Chebychev gm-C LPF is able to be broken down into three gm-C filter blocks, in which two amplifiers (VCVSs) of respective voltage gains $G_{V1}$ and $G_{V2}$ are inserted between the 1st-order gm-C LPF and the next stage 2nd-order gm-C LPF and between the 2nd-order gm-C LPF and another final stage 2nd-order gm-C LPF. The placements of these three gm-C LPF blocks are mutually interchangeable.

Figure 14:
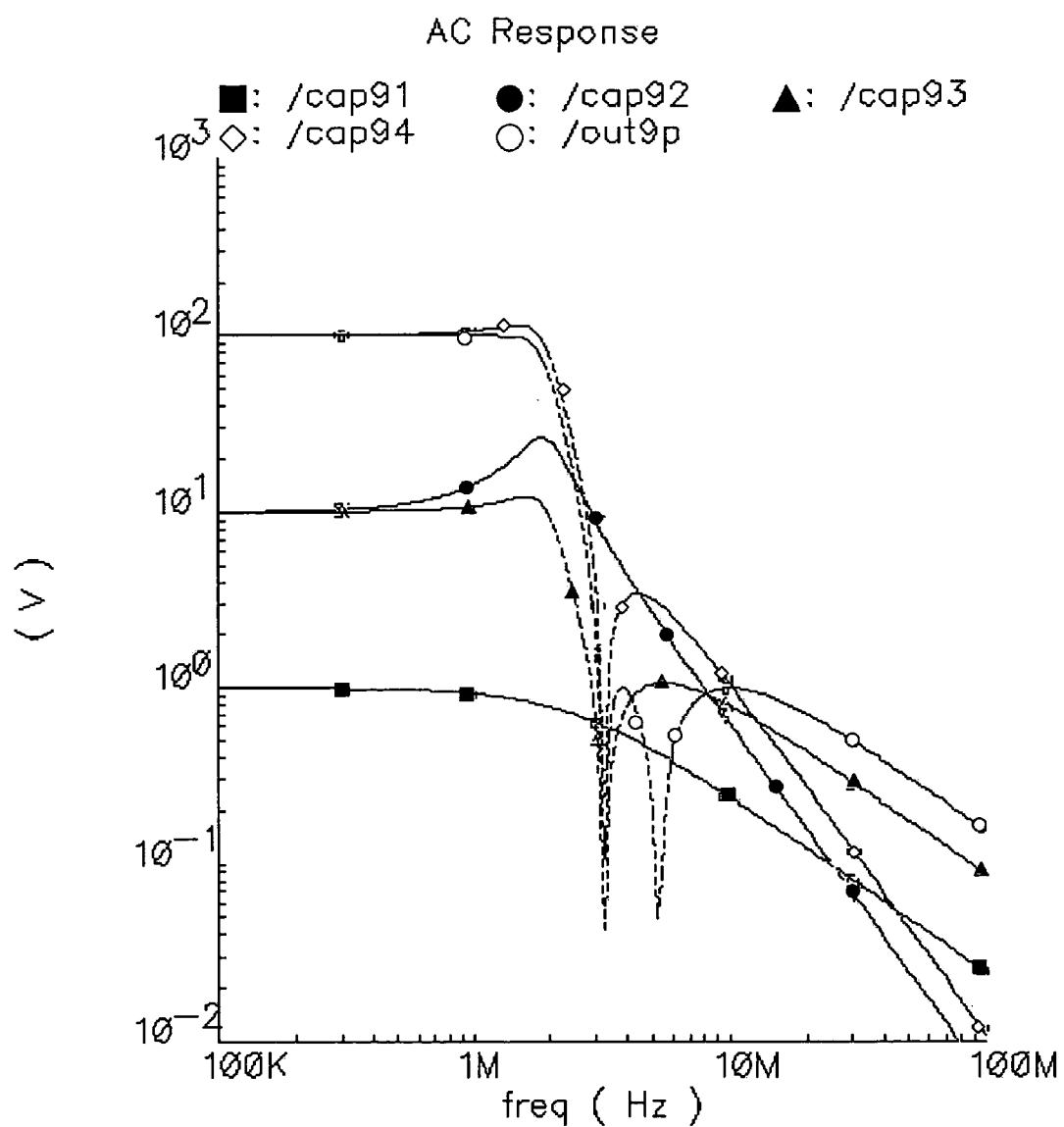
FIG. 14 is a drawing illustrating the simulation values of the amplitude characteristic of the 5th-order inverse Chebychev LPF of the present invention. ($G_{V1}=G_{V2}=10$)

Further, it is effective to replace an amplifier with an amplifier such as a VGA, and divide a filter to dispose divided filters in an application such as a wireless device. As a concrete example, the frequency response in case where the voltage gains of the two amplifiers (VCVSs) are set to 10 times (×10) is shown in FIG. 14.

The amplitude of the 5th-order inverse Chebychev gm-C LPF is 100 at the final stage output (out9p), but there is no change in the frequency response.

Embodiment 3

Figure 15:
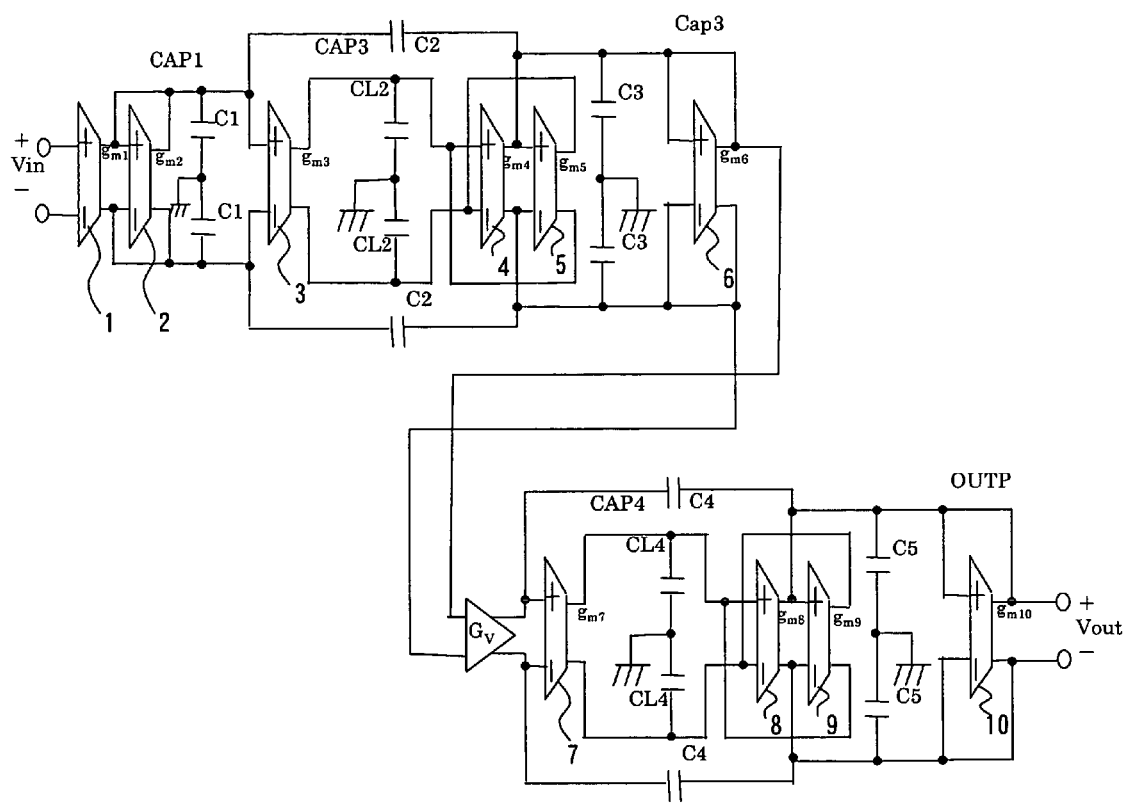
FIG. 15 is a diagram illustrating a circuit realized by gm-C filters of the 5th-order inverse Chebychev LPF showing another embodiment of the present invention.

Further, in the case of the 5th-order inverse Chebychev gm-C LPF, the 1st-order gm-C LPF and the next stage 2nd-order gm-C LPF are connected and an amplifier (VCVS) with a voltage gain Gv is inserted between the connected block and the third stage 2nd-order gm-C LPF as shown in FIG. 15. Each constant in this case is derived as follows.

Here, the transfer function of the 5th-order inverse Chebychev gm-C LPF shown in FIG. 15 is given:

$$H(s) = \frac{2g_{m1}(C_2C_{L2}s^2 + 4g_{m3}g_{m4})(C_4C_{L4}s^2 + 4g_{m7}g_{m8})}{\{C_{L4}(C_4+C_5)s^2 + 2g_{m10}C_{L4}s + 4g_{m8}g_{m9}\}} \quad (60)$$
$$\{C_{L2}(C_1C_3 + C_1C_2 + C_2C_3)s^3 +$$
$$C_{L2}(2g_{m6}C_1 + 2g_{m2}C_2 + 2g_{m6}C_2 + 2g_{m2}C_3)s^2 +$$
$$(4g_{m2}g_{m6}C_{L2} + 4g_{m4}g_{m5}C_1 +$$
$$4g_{m4}g_{m6}C_2 - 4g_{m3}g_{m4}C_2)s +$$
$$8g_{m2}g_{m4}g_{m6}\}$$

The equation (60) can be decomposed into:

$$H_1(s) \cdot H_2(s) = \frac{2g_{m1}(C_2 C_{L2} s^2 + 4g_{m3}g_{m4})(C_4 C_{LA} s^2 + 4g_{m7}g_{m8})}{C_{L2}(C_1 C_3 + C_1 C_2 + C_2 C_3)s^3 + C_{L2}(2g_{m6}C_1 + 2g_{m2}C_2 + 2g_{m6}C_2 + 2g_{m2}C_3)s^2 + (4g_{m2}g_{m6}C_{L2} + 4g_{m4}g_{m5}C_1 + 4g_{m4}g_{m6}C_2 - 4g_{m3}g_{m4}C_2)s + 8g_{m2}g_{m4}g_{m5}\}} \quad (61)$$

and $$H_3(s) = \frac{C_4 C_{LA} + 4g_{m7}g_{m8}}{C_{LA}(C_4 + C_5)s^2 + 2g_{m10}C_{LA}s + 4g_{m8}g_{m9}} \quad (62)$$

Here, when $g_{m1}=g_{m2}=g_{m3}=g_{m4}=g_{m5}=g_{m6}=g_{m7}=g_{m8}=g_{m9}=g_{m10}=g_m$, the following equations hold:

$$H_1(s) \cdot H_2(s) = \frac{2g_m(C_2 C_{L2} s^2 + g_m^2)}{\{C_{L2}(C_1 C_3 + C_1 C_2 + C_2 C_3)s^3 + 2g_m C_{L2}(C_1 + 2C_2 + C_3)s^2 + 4g_m^2(C_{L2} + C_1)s + 8g_m^3\}} \quad (63)$$

$$= \frac{\dfrac{2g_m C_2 s^2}{C_1 C_3 + C_1 C_2 + C_2 C_3} + \dfrac{8g_m^3}{C_{L2}(C_1 C_3 + C_1 C_2 + C_2 C_3)}}{s^3 + \dfrac{2g_m(C_1 + 2C_2 + C_3)}{C_1 C_3 + C_1 C_2 + C_2 C_3}s^2 + \dfrac{4g_m^2(C_1 + C_{L2})}{C_{L2}(C_1 C_3 + C_1 C_2 + C_2 C_3)}s + \dfrac{8g_m^3}{C_{L2}(C_1 C_3 + C_1 C_2 + C_2 C_3)}}$$

$$H_3(s) = \frac{C_4 C_{LA} + 4g_m^2}{C_{LA}(C_4 + C_5)s^2 + 2g_m C_{LA} s + 4g_m^2} \quad (64)$$

$$= \frac{\dfrac{C_4}{(C_4 + C_5)}s^2 + \dfrac{4g_m^2}{C_{LA}(C_4 + C_5)}}{s^2 + \dfrac{2g_m}{C_4 + C_5}s + \dfrac{4g_m^2}{C_{LA}(C_4 + C_5)}}$$

Since the equation (61) does not seem to be able to be factorized into the product of $H_1(s)$ and $H_2(s)$, the equations (41) and (42) are expanded:

$$H_1(s) \cdot H_2(s) = \frac{0.457615268 s^2 + 1.321287197}{s^3 + 1.776907782 s^2 + 1.679416807 s + 1.32128797} \quad (65)$$

The coefficients of the equations (63) and (65) are identical, therefore:

$$\frac{2g_m C_2}{C_1 C_3 + C_1 C_2 + C_2 C_3} = 0.457615268 \quad (66)$$

$$\frac{8g_m^3}{C_{L2}(C_1 C_3 + C_1 C_2 + C_2 C_3)} = 1.321287197 \quad (67)$$

$$\frac{2g_m(C_1 + 2C_2 + C_3)}{C_1 C_3 + C_1 C_2 + C_2 C_3} = 1.776907782 \quad (68)$$

$$\frac{4g_m^2(C_1 + C_{L2})}{C_{L2}(C_1 C_3 + C_1 C_2 + C_2 C_3)} = 1.679416807 \quad (69)$$

The coefficients of the equations (44) and (64) become identical as well, therefore:

$$\frac{C_4}{C_4 + C_5} = 0.176570447 \quad (70)$$

$$\frac{4g_m^2}{C_{LA}(C_4 + C_5)} = 1.334425094 \quad (71)$$

$$\frac{2g_m}{C_4 + C_5} = 1.696115678 \quad (72)$$

First, the constant included in $H_3(s)$ are determined:
From the equation (72):

$$C_4 + C_5 = \frac{10\mu}{1.696115678 \times 2\pi \times 1.92M} \quad (73)$$
$$= 0.4887237383 \text{ [pF]}$$

Since $C_4 = 0.214432972 C_5$ from the equation (70):

$$C_4 = 0.086294168 \text{ [pF]} \quad (74)$$

$$C_5 = 0.402429569 \text{ [pG]} \quad (75)$$

The equation (72) is substituted into the equation (71), and it is given as follows:

$$C_{LA} = \frac{10\mu}{(1.334425094/1.696115678) \times 2\pi \times 1.92M} \quad (76)$$
$$= 1.053610697 \text{ [pF]}$$

Next, the constants included in $H_1(s) \cdot H_2(s)$ are determined. When the equation (67) is divided by the equation (69), $$\frac{2g_m}{C_1 + C_{L2}} = 0.786753587 \quad (77)$$

From the equation (75), we have:

$$C_1 + C_{L2} = \frac{10\mu}{0.786753587 \times 2\pi \times 1.92M} \quad (78)$$
$$= 1.053610697 \text{ [pF]}$$

$$\therefore C_1 = 1.053610697 \text{[pF]} - C_{L2} \quad (79)$$

When the equation (68) is divided by the equation (66), we have:

$$\frac{C_1 + 2C_2 + C_3}{C_2} = \frac{C_1}{C_2} + 2 + \frac{C_3}{C_2} = 3.882973114 \quad (80)$$

-continued $$\therefore \frac{C_1}{C_2} + \frac{C_3}{C_2} = 1.882973114 \quad (81)$$

As a result, $C_2$ is give as follows:

$$C_2 = \frac{C_1 + C_3}{1.882973114} \quad (82)$$

When the equations (66) through (69) are filled by using Excel to fit $C_{L2}$ and $C_3$, the respective constant with which the errors of the equations (66) through (69) are not higher than ±0.02% can be given as follows:

$C_1$=0.6915107 [pF] (83)

$C_{L2}$=0.3621 [pF] (84)

$C_2$=0.6571314 [pF] (85)

$C_3$=0.54585 [pF] (86)

Figure 16:
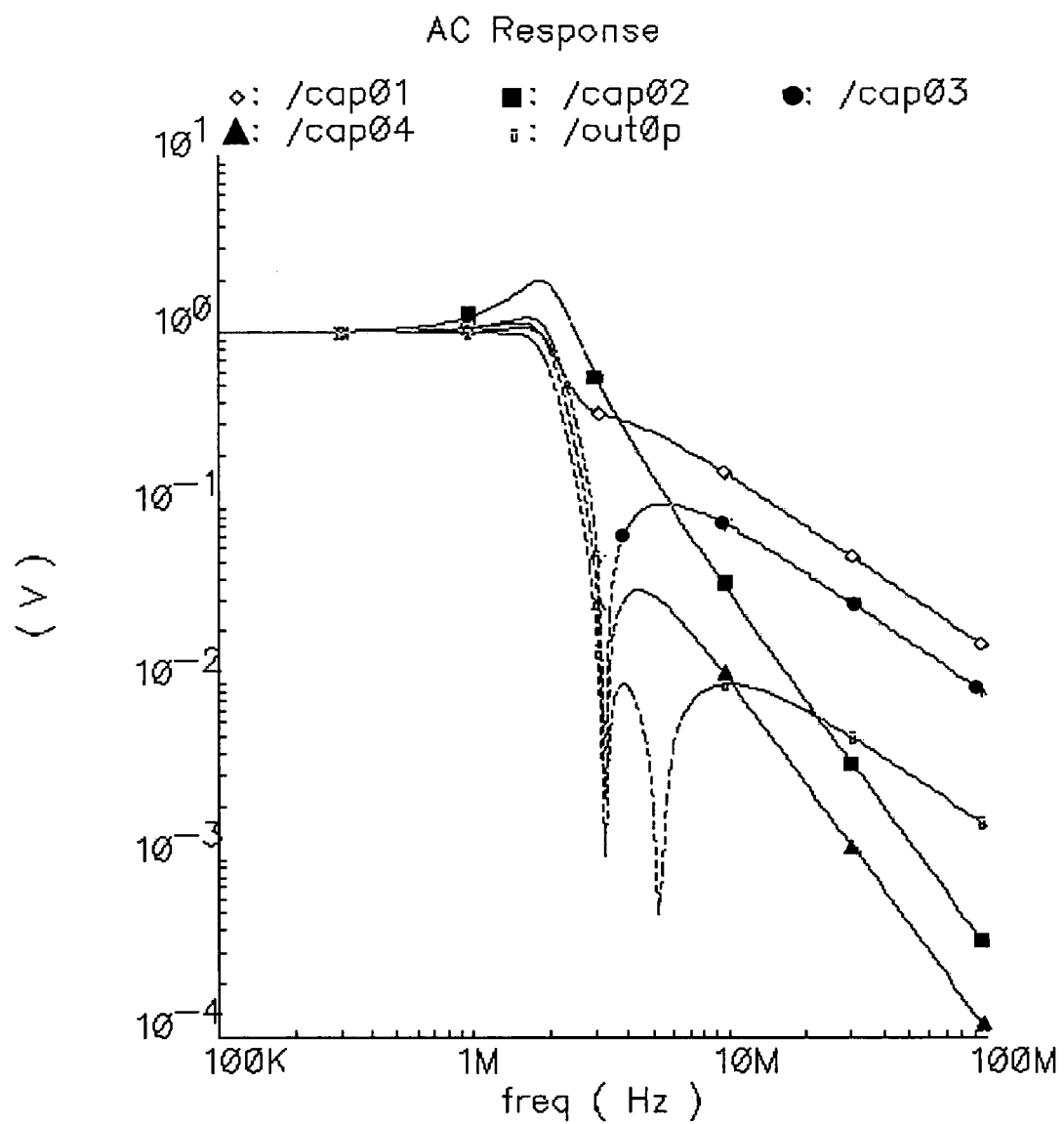
FIG. 16 is a drawing illustrating the simulation values of the amplitude characteristic of the 5th-order inverse Chebychev LPF showing another embodiment of the present invention.

The simulation result of the frequency response with the obtained constants are shown in FIG. 16. The amplitude characteristic of the output (out0$p$) of the 5th-order inverse Chebychev gm-C LPF is identical to that of FIG. 12. However, the amplitude peak value at the cap02 terminal decreases 2.0 times as much by jointing the 1st-order LPF and the 2nd-order LPF.

Figure 17:
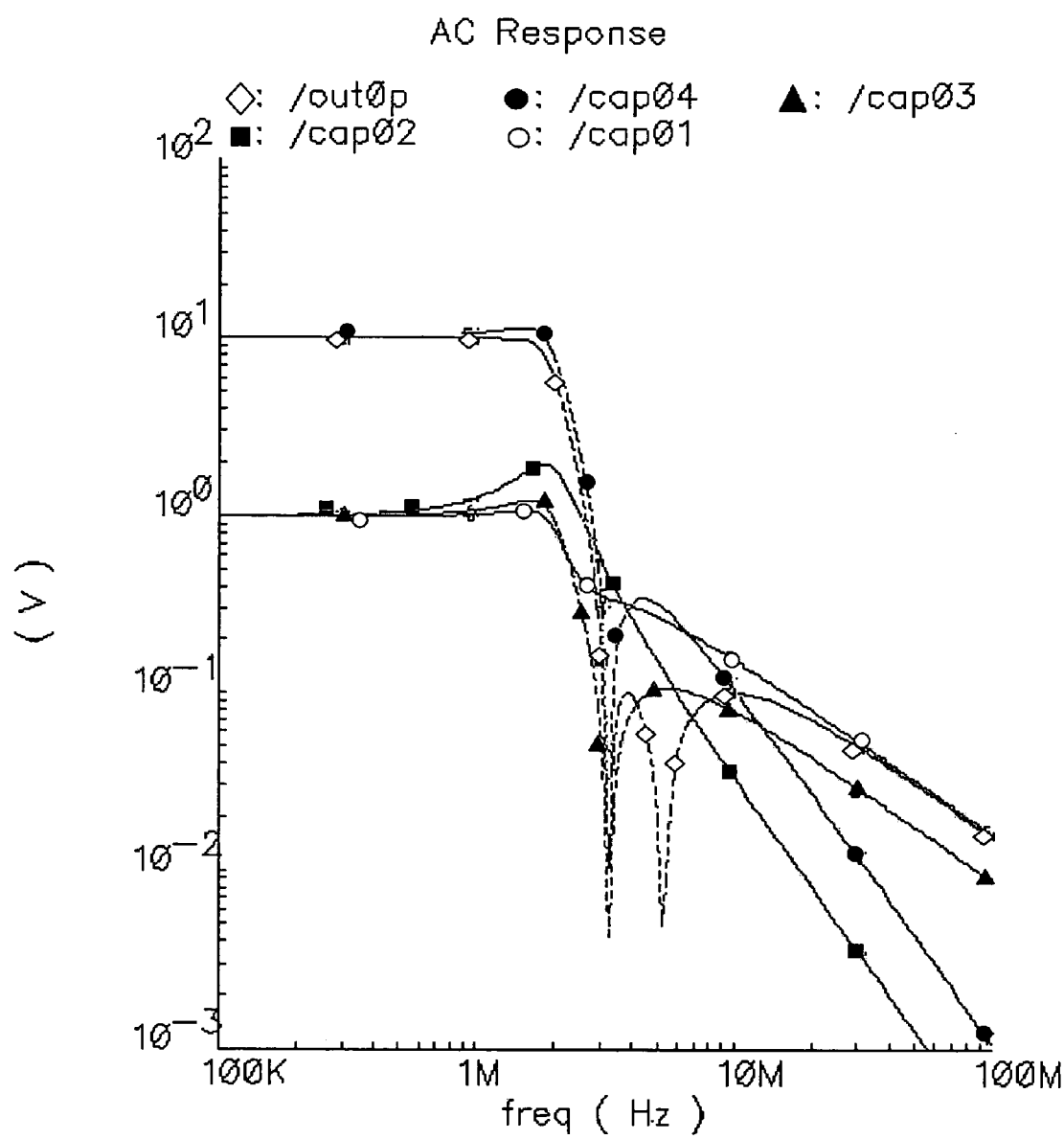
FIG. 17 is a drawing illustrating the simulation values of the amplitude characteristic of the 5th-order inverse Chebychev LPF showing another embodiment of the present invention. ($G_V=10$)

Similarly, the frequency response in case where the voltage gain of the amplifier (VCVS) is 10 times as much is shown in FIG. 17. The amplitude of the output (out0$p$) of the 5th-order inverse Chebychev gm-C LPF is 10, however, the frequency response remains the same.

The transfer function H(s) of the 5th-order inverse Chebychev LPF is given by the equation (39). The derivation method will be further described. As in case where the transfer function of the 3rd-order inverse Chebychev LPF is derived, the transfer function of a 5th-order Chebychev LPF is derived first.

Figure 18:
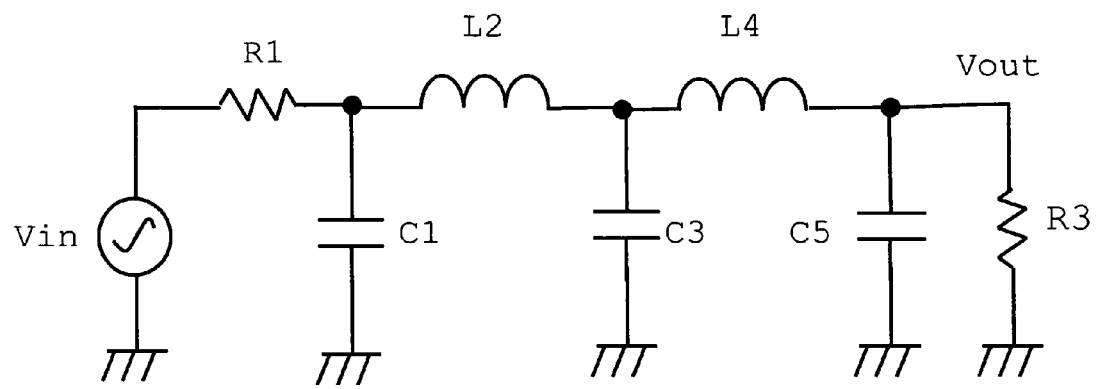
FIG. 18 is a diagram showing the circuit of a 5th-order LCR ladder LPF for explaining the present invention.

FIG. 18 is a circuit diagram of a 5th-order Chebychev LC ladder LPF. The transfer function $T_C(s)$ of the 5th-order Chebychev LC ladder LPF is given as follows when R1=R3=1, C1=C5=$c_1$, C3=$c_2$, L2=L4=$l$:

$$T_C(s) = \frac{2}{c_1^2 l^2 c_2 s^5 + 2c_1 l^2 c_2 s^4 + (2c_1^2 l + 2c_1 l c_2 + l^2 c_2) s^3 + (4c_1 l + 2l c_2) s^2 + (2c_1 + 2l + c_2) s + 2} \quad (87)$$

Note that the numerator is set to 2 so that $T_C(0)$=1.

The square of the amplitude characteristic of the equation (87) is given:

$$|T_C(j\omega)|^2 = \frac{4}{\{2 - (4c_1 l + 2l c_2)\omega^2 + 2c_1 l^2 c_2 \omega^4\}^2 + \{(2c_1 + 2l + c_2)\omega - (2c_1^2 l + 2c_1 l c_2 + l^2 c_2)\omega^3 + c_1^2 l^2 c_2 \omega^5\}^2} \quad (88)$$

The replacement of the passband by the stopband gives:

$$1 - |T_c(j\omega)|^2 = \quad (89)$$

$$\frac{\{(2c_1 - 2l + c_2)\omega - (2c_1^2 l + 2c_1 l c_2 - l^2 c_2)\omega^3 + c_1^2 l^2 c_2 \omega^5\}^2}{\{2 - (4c_1 l + 2l c_2)\omega^2 + 2c_1 l^2 c_2 \omega^4\}^2 + \{(2c_1 + 2l + c_2)\omega - (2c_1^2 l + 2c_1 l c_2 + l^2 c_2)\omega^3 + c_1^2 l^2 c_2 \omega^5\}^2}$$

The exchange of frequency axes gives:

$$1 - |T_c(j/\omega)|^2 = \quad (90)$$

$$\frac{\{(2c_1 - 2l + c_2)\omega^4 - (2c_1^2 l + 2c_1 l c_2 - l^2 c_2)\omega^2 + c_1^2 l^2 c_2\}^2}{\{2\omega^5 - (4c_1 l + 2l c_2)\omega^3 + 2c_1 l^2 c_2 \omega\}^2 + \{(2c_1 + 2l + c_2)\omega^4 - (2c_1^2 l + 2c_1 l c_2 + l^2 c_2)\omega^2 + c_1^2 l^2 c_2\}^2}$$

The transfer function H(s) of the 5th-order inverse Chebychev LPF is given as follows:

$$H(s) = \frac{(2c_1 - 2l + c_2)s^4 + (2c_1^2 l + 2c_1 l c_2 - l^2 c_2)s^2 + c_1^2 l^2 c_2}{2s^5 + (2c_1 + 2l + c_2)s^4 + (4c_1 l + 2l c_2)s^3 + (2c_1^2 l + 2c_1 l c_2 + l^2 c_2)s^2 + 2c_1 l^2 c_2 s + c_1^2 l^2 c_2} \quad (91)$$

Note that the equation (87) is able to be applied to a 5th-order Butterworth LPF as well. The relationship between the numerator and denominator in the equation (91) is notable. The second term of the denominator in the equation (91):

$$\{(2c_1+2l+c_2)\omega^4-(2c_1^2 l+2c_1 l c_2+l^2 c_2)\omega^2+c_1^2 l^2 c_2\}^2$$

and the numerator:

$$\{(2c_1-2l+c_2)\omega^4-(2c_1^2 l+2c_1 l c_2-l^2 c_2)\omega^2+c_1^2 l^2 c_2\}^2$$

can be expressed by:

$$\{(2c_1 \mp 2l+c_2)\omega^4-(2c_1^2 l+2c_1 l c_2 \mp l^2 c_2)\omega^2+c_1^2 l^2 c_2\}^2$$

Looking at each coefficient of $\omega^n$, since the numerator has minus signs and the denominator has plus signs, each coefficient of $\omega^n$ of the numerator is smaller than each coefficient of $\omega^n$ of the denominator.

Figure 19:
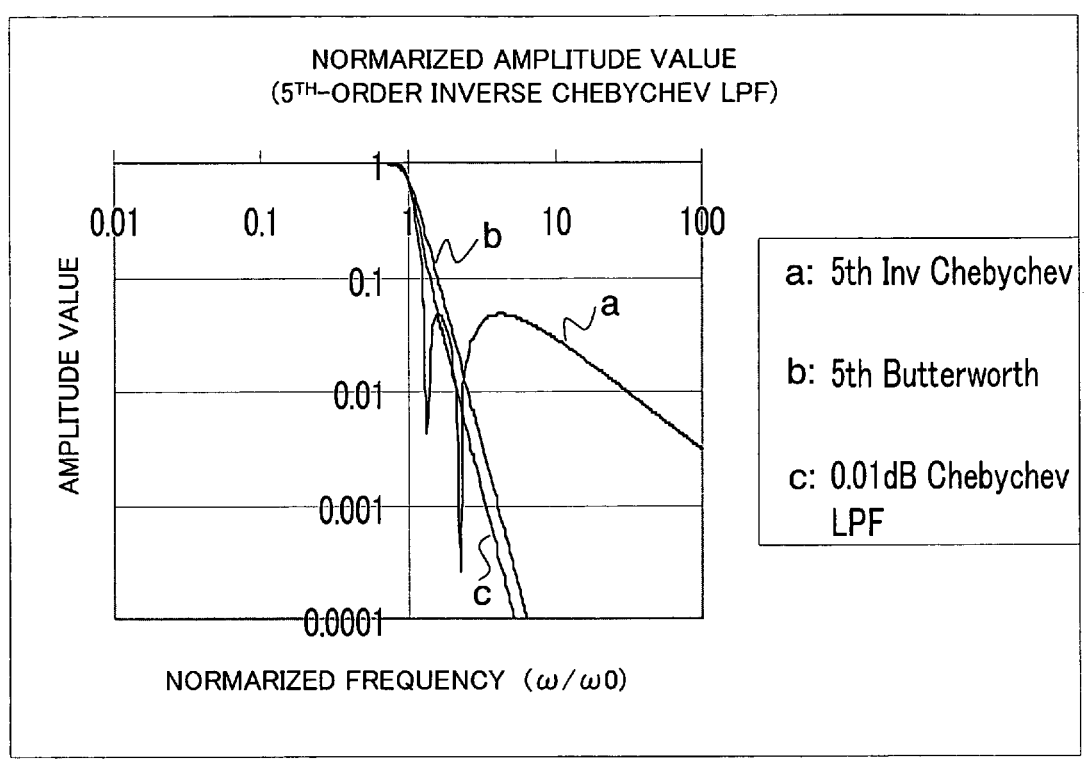
FIG. 19 is a drawing illustrating the normalized amplitude characteristic of the 5th-order inverse Chebychev LPF for explaining the present invention.

By square-rooting the equation (91), the amplitude characteristic of the 5th-order inverse Chebychev LPF given by an equation (92) can be obtained. For instance, FIG. 19 shows a graph made by substituting the constants R1=R3=1 Ω, C1=C5=$c_1$=0.9766F, C3=$c_2$=2.0366F, and L2=L4=$l$=1.6849H of the original 0.01 dB ripple 5th-order Chebychev LPF.

(0.01 dB ripple 5th-order Chebychev LPF:

$$T_c(s) = \frac{2}{5.514263 s^5 + 11.29278 s^4 + 15.69796 s^3 + 13.44483 s^2 + 7.3596 s + 2};$$

5th-order Butterworth LPF:

$$T(s) = \frac{2}{2s^5 + 6.47135955s^4 + 10.47213595s^3 + 10.47213595s^2 + 6.47135955s + 2};$$

5th-order inverse cbc LPF:

$$H(s) = \frac{0.62s^4 + 4.134601s^2 + 5.514263}{2s^5 + 7.3596s^4 + 13.44483s^3 + 15.69796s^2 + 11.29278s + 5.514263}$$

)

Although the amplitude characteristic of the 0.01 dB ripple 5th-order Chebychev LPF and the amplitude characteristic of the 5th-order Butterworth LPF are almost the same in the passband, marked differences in the attenuation characteristic are seen in the stopband. The equiripple characteristic of the stopband does not attenuate as much as 30 dB in the amplitude characteristic of the inverse Chebychev LPF. Further, the amplitude characteristic of the inverse Chebychev LPF is better than the attenuation characteristic of the 0.01 dB ripple 5th-order Chebychev LPF until the first transmission zero, however, after that, the attenuation characteristic of the inverse Chebychev LPF is not as much as that of the 0.01 dB ripple 5th-order Chebychev LPF.

However, the amplitude characteristic of the inverse Chebychev LPF is superior to that of the 5th-order Butterworth LPF until the point just beyond the second transmission zero.

Figure 20:
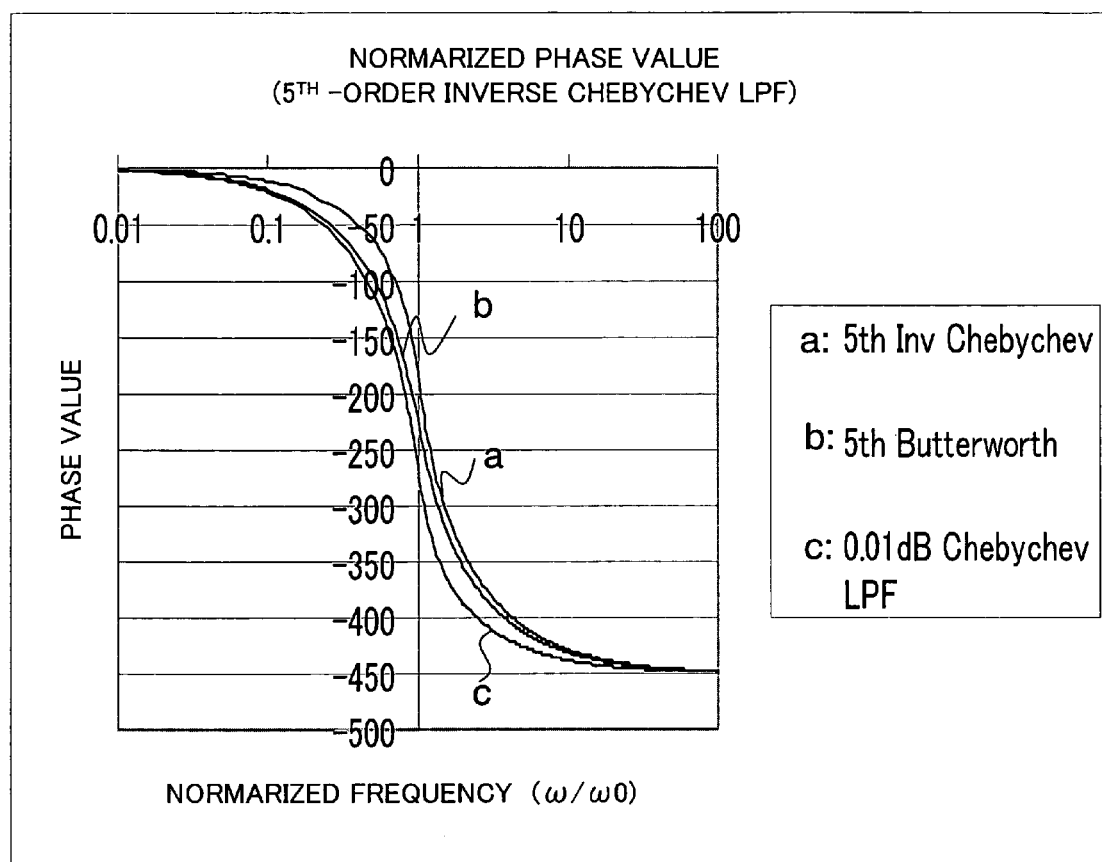
FIG. 20 is a drawing illustrating the normalized phase characteristic of the 5th-order inverse Chebychev LPF for explaining the present invention.

FIG. 20 shows the phase characteristic of the 5th-order inverse Chebychev LPF along with the phase characteristics of the 0.01 dB ripple 5th-order Chebychev LPF and the 5th-order Butterworth LPF.

The phase characteristic of the 5th-order inverse Chebychev LPF is smoother than, and superior to the phase characteristics of the 0.01 dB ripple 5th-order Chebychev LPF and the 5th-order Butterworth LPF in the passband ($\omega<1$).

Now we will return to the description of how the transfer function of the 5th-order Chebychev LPF is factorized.

The transfer function of the 0.01 dB ripple 5th-order Chebychev LPF is given as follows:

$$T_c(s) = \frac{0.362696}{(s + 0.6328)(s^2 + 1.024s + 0.60777)(s^2 + 0.3912s + 0.94304)} \quad (92)$$

Expanding the denominator in the expression (92) gives:

$$T_c(s) = \frac{0.362696}{s^5 + 2.047921s^4 + 2.846792s^3 + 2.438191s^2 + 1.334648s + 0.3962696} \quad (93)$$

The equation (93) is the equation (86) with the denominator and the numerator divided by c1212c2=5.514263, and the same transfer function is given.

The equation (92) is derived from the pole locations of the 5th-order Chebychev LPF. The equations (8) through (14) are similarly applied with n=5(5th-order) in the derivation method.

For instance, in order to obtain an equiripple attenuation characteristic of −40 dB with an inverse Chebychev LPF, $\alpha_{max}$=0.0004342 dB and $\epsilon$=0.01. From the equation (16), a=1.059685274 and sin h(a)=1.269449. Further, $\Phi_K$=18°, 54°, and 0°, and the following is derived:

$p_1, p_2 = -0.392281314 \pm j1.536920645$ $p_3, p_4 = -1.027005815 \pm j0.949869196$ $p_5 = -1.269449$

The transfer function of the 0.0004342 dB ripple 5th-order Chebychev LPF is given as follows:

$$T_c(s) = \frac{6.250525}{(s + 1.2694489)(s^2 + 0.784563s + 2.516009)(s^2 + 2.054012s + 1.956992)} \quad (94)$$

Expanding the denominator in the expression (94) gives:

$$T_c(s) = \frac{6.250525}{s^5 + 4.108023s^4 + 9.687927s^3 + 14.42726s^2 + 13.4333s + 6.250525} \quad (95)$$

Note that the cut-off frequency $\omega_{hp}$ (hp:half-power) is similarly given by the equation (17), and in the case of the 0.0004342 dB ripple 5th-order Chebychev LPF, the cut-off frequency $\omega_{hp}$=1.616001. When the cut-off frequency $\omega_{hp}$=1, the transfer function of the 0.0004342 dB ripple 5th-order Chebychev LPF is given as follows:

$$T_c(s) = \frac{0.567163}{s^5 + 2.542092s^4 + 3.709775s^3 + 3.418683s^2 + 1.969773s + 0.567163} \quad (96)$$

When the denominator is factorized, the transfer function is given as follows:

$$T_c(s) = \frac{0.567163}{(s + 0.78555)(s^2 + 0.485496s + 0.963449465)(s^2 + 1.271046s + 0.749386387)} \quad (97)$$

Comparing the coefficients of the equations (87) and (96), $c_1$=0.786753587, l=1.696112321, and $c_2$=1.980320286 hold. Note that $c_1$, l, and $c_2$ must be selected so that the $5^{th}$ through $0^{th}$-order coefficients are identical. The values of $c_1$, l, and $c_2$ with which the $5^{th}$, 4th and 0th-order coefficients are the same but the 3rd and 2nd-order coefficients differ by a few percents exist.

When these values are substituted for the equation (78), the transfer function H(s) of the 5th-order inverse Chebychev LPF is given by the following equation:

$$H(s) = \frac{0.161603s^4 + 1.687912s^2 + 3.526323}{2s^5 + 6.946052s^4 + 12.05538s^3 + 13.08187s^2 + 8.964238s + 3.526323} \quad (98)$$

Or:

$$H(s) = \frac{0.045828s^4 + 0.47866s^2 + 1}{0.567163s^5 + 1.969772s^4 + .3418683s^3 + 3.709776s^2 + 2.542092s + 1} \quad (99)$$

From the equation (96), the denominator of the transfer function H(s) of the 5th-order inverse Chebychev LPF is as follows:

$$H(s) = \frac{as^4 + bs^2 + 1}{0.567163s^5 + 1.969773s^4 + 3.418683s^3 + 3.709775s^2 + 2.542092s + 1} \quad (100)$$

The denominator of the equation (100) is the same as that of the equation (99). The numerator of the equation (100) is the same as that of the equation (99) as well. Therefore, a=0.045828 and b=0.47866 in the numerator of the equation (100). Similarly, from the equation (97), the denominator of the transfer function H(s) of the 5th-order inverse Chebychev LPF is factorized as follows:

$$H(s) = \frac{0.0458276s^4 + 0.47866s^2 + 1}{(1+0.78555s)(1+0.485496s+0.963449465s^2)(1+1.271046s+0.749386387s^2)} \quad (101)$$

Therefore, the transfer function H(s) of the 5th-order inverse Chebychev LPF is given as follows:

$$H(s) = \frac{(0.3463405s^2+1)(0.13231949s^2+1)}{(1+0.78555s)(1+0.485496s+0.963449465s^2)(1+1.271046s+0.749386387s^2)} \quad (102)$$

The amplitude characteristic of the 5th-order Chebychev LPF obtained as described above is shown in FIG. 9 (characteristic c in FIG. 9), and the phase characteristic is shown in FIG. 10 (characteristic a in FIG. 10.)

How to derive transfer functions of 3rd-order and 5th-order inverse Chebychev LPFs have been described above. Further, in the examples of inverse Chebychev LPFs, only ones with a ripple of −18 dB or around −20 dB in the attenuation band have been shown. This may give an impression that much attenuation cannot be obtained.

However, as shown in examples of −26 dB and −40 dB, a desired equiripple characteristic in the attenuation band can be obtained. Regarding inverse Chebychev LPFs, even-order LPFs such as 2nd-order and 4th-order LPFs and 7th or higher odd-order LPFs are defined, however, as one can easily conjecture from the method for deriving the 5th-order transfer function, the method for deriving high-order transfer functions come with a great deal of difficulty.

However, the following generalization can be made from the above-described methods for deriving the transfer functions of the inverse Chebychev LPFs.

$\alpha_{min}$[dB] is the equiripple characteristic in the attenuation band. Now, when $\alpha_{mi}$ is set to 60 dB and n=7 (7th-order), $\epsilon$=0.001(=10−3), therefore 20 log($\epsilon$)=−$\alpha_{min}$, and the following equation is given:

$$\varepsilon = 10^{-\frac{\alpha_{min}}{20}} = \sqrt{10^{-\frac{\alpha_{min}}{10}}} \quad (103)$$

Next, equation (8) is used as it is:

$$a = \frac{1}{n}\sinh^{-1}\left(\frac{1}{\varepsilon}\right) \quad (104)$$

Then, k=0, 1, 2, 3 are substituted using the following:

$$\phi_k = \frac{2k+1}{n}\frac{\pi}{2} \quad k=0, 1, \ldots, 2n-1 \quad (105)$$

As a result, 12.8571°, 38.5714°, 64.2857°, and 90° are obtained.

Now the following equations are calculated:

$$-\alpha_K = \sin h(a) \cdot \sin(\Phi_K) \quad (106)$$

$$\pm\beta_K = \cos h(a) \cdot \cos(\Phi_K) \quad (107)$$

Since cos(90°)=0, the followings hold:

$$a_0 = \alpha_3/\cos h(a) \quad (108)$$

$$b_K = 2\alpha_K/\cos h(a) \quad (109)$$

$$c_K = (\alpha_K^2 + \beta_K^2)/\cos h^2(a) \quad (110)$$

Further, as for the coefficients of the denominators, the following hold:

$$\Omega_2 = \sin(\pi/n)/\cos h^2(a),$$

$$\Omega_4 = \sin(2\pi/n)/\cos h^2(a),$$

$$\Omega_6 = \sin(4\pi/n)/\cos h^2(a) \quad (111)$$

Based on the above, the following equations are given, for an odd-order (n=3, 5, 7, . . . ):

$$H(s) = \frac{\prod_{i=1}^{(n-1)/2}(1+\Omega_{2i}^2 s^2)}{(1+a_0 s)\prod_{i=1}^{(n-1)/2}(1+b_{2i}s+c_{2i}s^2)} \quad (112)$$

and for an even-order (n=2, 4, 6, ...):

$$H(s) = \frac{\prod_{i=1}^{n/2}(1+\Omega_{2i}^2 s^2)}{\prod_{i=1}^{n/2}(1+b_{2i}s+c_{2i}s^2)} \quad (113)$$

The present invention has been described in detail using inverse Chebychev filters with elliptic characteristics as examples. The method of embodying the present invention to the inverse Chebychev filter described in detail, can be similarly applied to elliptic filters (cauer filters). The method for deriving the transfer function of an elliptic filter (cauer filter) is described in routine textbooks. Further, as mentioned above, the methods for deriving the transfer functions of a Butterworth filter, Chebychev filter, and Bessel filter are similarly described in routine text books, and a normalized constant of each element in the LCR ladder filter is usually found in data books and widely known. So detailed description thereof will be omitted here.

However, such a Butterworth filter, Chebychev filter, and Bessel filter are realized by eliminating the elliptic capacitors C2 and C4 from the gm-C filter circuits shown in FIGS. 3, 11, and 15, respectively and the transfer function can be obtained by making the elliptic capacitors C2 and C4 zero.

Figure 21:
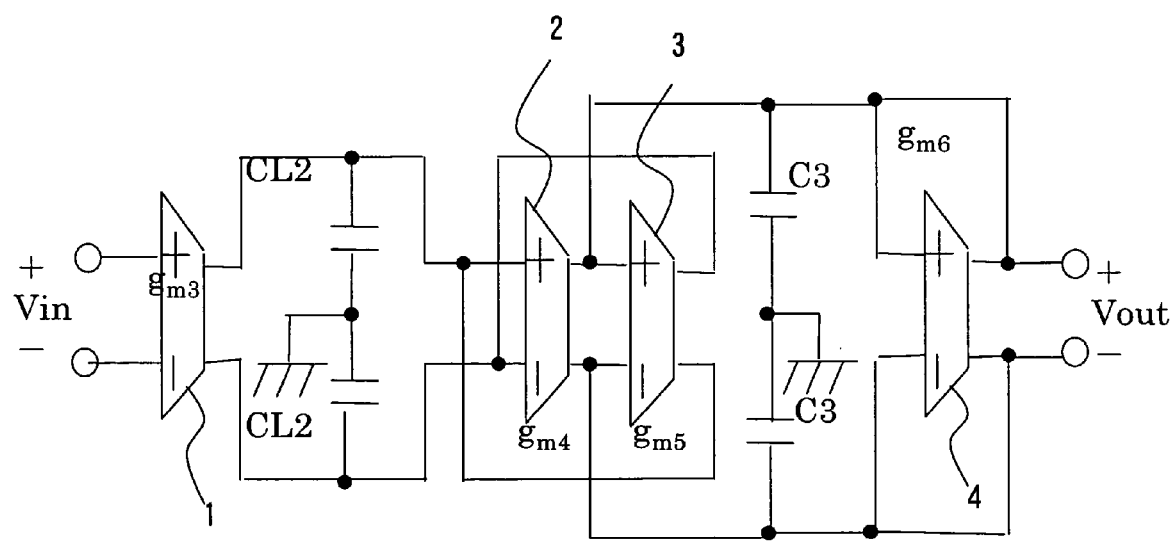
FIG. 21 is a diagram illustrating a circuit realized by a gm-C filter of a 2nd-order LPF for explaining the present invention.

For instance, if the elliptic capacitors C2 is eliminated from the 2nd-order elliptic gm-C LPF in the succeeding stage of the amplifier of the 3rd-order inverse Chebychev gm-C LPF shown in FIG. 3, it will become a 2nd-order gm-C LPF shown in FIG. 21, and when C2=0 in the equation (23), the transfer function of the 2nd-order gm-C LPF is obtained. The transfer function T2(s) is expressed as follows:

$$T_2(s) = \frac{V_{out}}{V_{in}} = \frac{\frac{4g_{m3}g_{m4}}{C_{L2}C_3}}{s^2 + s\frac{2g_{m6}}{C_3} + \frac{4g_{m4}g_{m6}}{C_{L2}C_3}} \quad (114)$$

Note that, in the equation (114), since $g_{m4}$, $g_{m5}$, and $g_{m6}$ are coefficients in the denominator, they determine the frequency response. On the other hand, since $g_{m3}$ is in the numerator only, it does not influence the frequency response, but determines the voltage gain of the 2nd-order LPF. In other words, the voltage gain of the 2nd-order LPF can be varied by increasing or decreasing the $g_m$ value of the OTA in the first input-stage.

However, as described in detail in the present application, in general it is set up so that $g_{m3}=g_{m4}=g_{m5}=g_{m6}=g_m$, and the equation (114) is expressed as follows:

$$T_2(s) = \frac{V_{out}}{V_{in}} = \frac{\frac{4g_m^2}{C_{L2}C_3}}{s^2 + s\frac{2g_m}{C_3} + \frac{4g_m^2}{C_{L2}C_3}} \quad (115)$$

It is not usually understood that the transconductance gm of the OTA of the 2nd-order LPF in the first input-stage is a constant determining the voltage gain of the 2nd-order LPF and that it does not influence the frequency response.

In other words, the amplifying means described in the present application is equivalently realized by increasing or decreasing the gm of the OTA in the first input-stage of the 2nd-order LPF while maintaining the capacitance value and the frequency response.

This method is a very effective technique for correcting an insertion loss of the 2nd-order filter. As concrete examples, there are techniques such as varying the value of $g_m$ of the OTA by varying the drive current of the OTA in the first input-stage of the 2nd-order LPF, or multiplying the voltage gain approximately by an integer i.e. approximately multiplying the $g_m$ by an integer by varying the number of the OTA connected in parallel.

Embodiment 4

Figure 22:
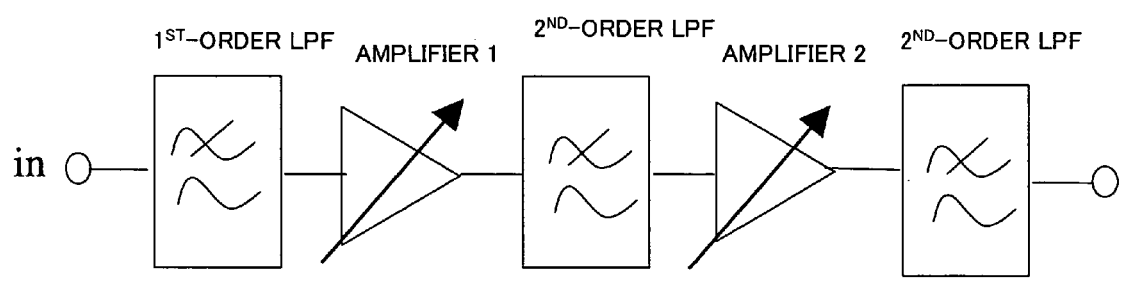
FIG. 22 is a diagram illustrating a filter circuit showing another embodiment of the present invention.

From the above descriptions, it is apparent that even when using amplifying means employing a variable gain amplifier, of which the gain can be varied instead of an amplifier with a fixed voltage gain, the frequency response is not influenced and only voltage gain is varied. In other words, as shown in FIG. 22, the voltage gain may be varied by making amplifiers 1 and 2 variable gain amplifiers.

Embodiment 5

Figure 23:
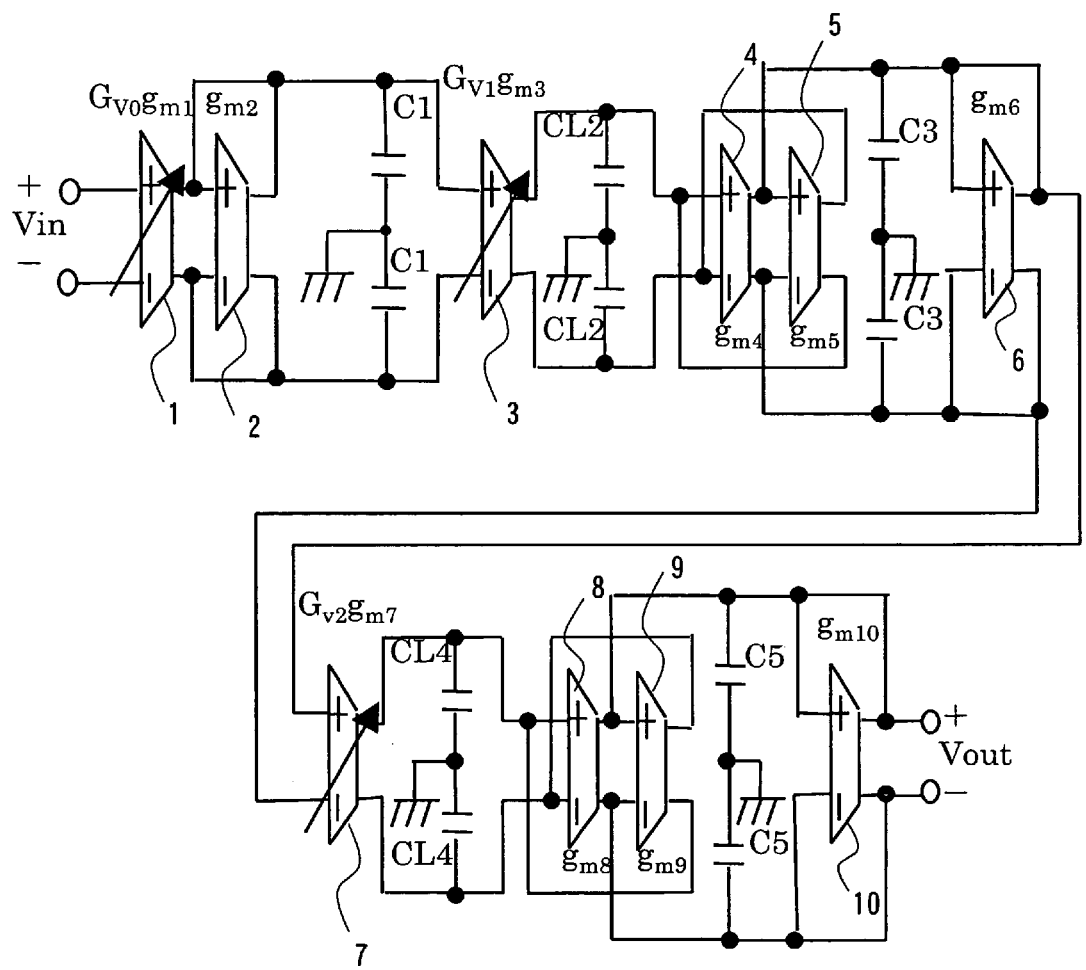
FIG. 23 is a diagram illustrating a circuit realized by gm-C filters of a 5th-order LPF showing another embodiment of the present invention.

With the Butterworth filter, Chebychev filter, and Bessel filter, which don't need any elliptic capacitor, as a 5th-order gm-C LPF shown in FIG. 23, the function of the variable gain amplifiers (amplifiers 1 and 2) can be equivalently achieved by varying the $g_m$ values of OTAs in the first input-stages of (a 1st-order gm-C LPF and) two 2nd-order gm-C LPFs.

The transfer function T(s) of the 5th-order gm-C LPF is expressed as follows:

$$T(s) = T_1(s) \times T_2(s) \times T_3(s) = \quad (116)$$

$$\frac{\frac{2g_{m1}}{C_1}}{s+\frac{2g_{m2}}{C_1}} \times \frac{\frac{4g_{m3}g_{m4}}{C_{L2}C_3}}{s^2+\frac{2g_{m6}}{C_3}s+\frac{4g_{m4}g_{m6}}{C_{L2}C_3}} \times \frac{\frac{4g_{m7}g_{m8}}{C_{L2}C_3}}{s^2+\frac{2g_{m10}}{C_3}s+\frac{4g_{m8}g_{m9}}{C_{L2}C_3}}$$

For instance, the transfer function T(s) in the case of a 5th-order Butterworth LPF is expressed and factorized as follows:

$$T(s) = \frac{1}{s^5+3.23668s^4+5.23607s^3+5.23607s^2+3.23668s+1} \quad (117)$$

$$= \frac{1}{(s+1)(s^2+1.603034s+1)(s^2+0.618034s+1)}$$

$$T_1(s) = \frac{1}{s+1} \quad (118)$$

$$T_1(s) = \frac{1}{s^2+1.603034s+1} \quad (119)$$

$$T_1(s) = \frac{1}{s^2+0.618034s+1} \quad (120)$$

Here, in the 5th-order gm-C LPF shown in FIG. 23, when respectively multiplying each $g_m$ value of an OTA1, OTA3, and OTA7 by $G_{V0}$, $G_{V1}$, and $G_{V2}$, thus making the values $G_{V0}g_{m1}$, $G_{V1}g_{m3}$, and $G_{V2}g_{m7}$, the transfer functions T(s) is given as follows:

$$T(s) = T_1(s) \times T_2(s) \times T_3(s) \quad (121)$$

$$G_{F0} \times G_{F1} \times G_{F2} \times \frac{\frac{2g_{m1}}{C_1}}{s + \frac{2g_{m2}}{C_1}} \times$$

$$\frac{\frac{4g_{m3}g_{m4}}{C_{L2}C_3}}{s^2 + \frac{2g_{m6}}{C_3}s + \frac{4g_{m4}g_{m6}}{C_{L2}C_3}} \times \frac{\frac{4g_{m7}g_{m8}}{C_{L2}C_3}}{s^2 + \frac{2g_{m10}}{C_3}s + \frac{4g_{m8}g_{m9}}{C_{L2}C_3}}$$

For instance, the transfer function T(s) in case of the 5th-order Butterworth LPF is expressed as follows:

$$T(s) = \frac{G_{F0} \times G_{F1} \times G_{F2}}{s^5 + 3.236068s^4 + 5.23607s^3 + 5.23607s^2 + 3.236068s + 1} \quad (122)$$

$$= \frac{G_{F0} \times G_{F1} \times G_{F2}}{(s+1)(s^2 + 1.603034s + 1)(s^2 + 0.618034s + 1)}$$

and the followings hold:

$$T_1(s) = \frac{G_{F0}}{s+1} \quad (123)$$

$$T_1(s) = \frac{G_{F1}}{s^2 + 1.603034s + 1} \quad (124)$$

$$T_1(s) = \frac{G_{F2}}{s^2 + 0.618034s + 1} \quad (125)$$

When the equations (116) and (121) are compared, one can see that the frequency response remains the same, but the level is multiplied by $G_{V0} \times G_{V1} \times G_{V2}$. In other words, an amplifier 0 whose voltage gain is multiplied by $G_{V0}$, an amplifier 1 whose voltage gain is multiplied by $G_{V1}$, and an amplifier 2 whose voltage gain is multiplied by $G_{V2}$ are equivalently obtained. It is understood that variable values can be easily created by varying the drive current of the OTAs and the $g_m$ values instead of setting the values of $G_{V0}$, $G_{V1}$, and $G_{V0}$ to fixed values.

The present invention is applied to a filter circuit integrated on a LSI chip. The present invention is suitably applied to the correction of an insertion loss of the filter circuit itself caused by the variance in the fabrication process or of a shift in the voltage gain of the filter, and to a receiving channel selection filter of a chip for a mobile wireless terminal device. When it is applied to the receiving channel selection filter, a plurality of high-voltage gain amplifiers such as VGAs and PGAs whose gains are varied with an exponential characteristic are implemented, and the present application is very effective for maintaining desirable noise characteristics.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A filter circuit having an order of three or more and a cutoff frequency $f_c$, said filter circuit comprising at least one amplifying unit for amplifying an in-band signal, a frequency response at an output of said filter circuit having an attenuation characteristic obtainable with said order of said filter circuit, based upon an attenuation measured at a frequency $2f_c$ and an expected attenuation of about 6 dB/octave per order, comprising a plurality of stages, each comprising at least one of a 1st-order filter and a 2nd-order filter, which are cascade-connected to each other, a summation of orders of said 1st-order and 2nd-order filters being (2×m+1), where m is an integer equal to or greater than 1;

wherein said amplifying unit comprises an amplifier arranged between an output of a first-stage filter and an input of a succeeding, second-stage filter, in at least one pair among a plurality of pairs of filters of adjacent stages.

2. The filter circuit according to claim 1, wherein a gain of said amplifying unit is variably controlled.

3. The filter circuit according to claim 1, comprising a 1st-order filter and m number of 2nd-order filter or filters, which are cascade-connected to each other; wherein said amplifying unit comprises an amplifier arranged between an output of a first-stage filter and an input of a succeeding, second-stage filter in at least one pair among m pairs of filters of adjacent stages.

4. The filter circuit according to claim 1, wherein a noise component amplified by said amplifier is attenuated by the succeeding-stage filter.

5. The filter circuit according to claim 1, wherein at least one of said 1st-order filter and said 2nd-order filter comprises a gm-C filter including an OTA (Operational Transconductance Amplifier) and a capacitor which is charged with a current output from the OTA, said current corresponding to an input voltage supplied to the OTA.

6. The filter circuit according to claim 1, wherein a voltage gain of said amplifier is variably controlled.

7. The filter circuit according to claim 5, wherein said gm-C filter constituting said 1st-order filter and/or said 2nd-order filter includes at least one OTA whose mutual conductance gm is variably controlled.

8. The filter of claim 1, said filter comprising an inverse filter wherein a pass band and a stop band relationship is functionally inversed in a design process of said filter.

9. The filter of claim 8, wherein said inverse filter comprises an inverse Chebychev filter.

10. The filter of claim 1, as incorporated on a chip.

11. A mobile wireless terminal device, incorporating the chip of claim 10 as a receiving channel selection filter.

12. A filter circuit having an order of three or more and a cutoff frequency $f_c$, said filter circuit comprising at least one amplifying unit for amplifying an in-band signal, a frequency response at an output of said filter circuit having an attenuation characteristic obtainable with said order of said filter circuit, based upon an attenuation measured at a frequency $2f_c$ and an expected attenuation of about 6 dB/octave per order, comprising a plurality of stages, each comprising at least one of a 1st-order filter and/or a 2nd-order filter, which are cascade-connected to each other, a summation of the orders of said 1st-order and 2nd-order filters being 2m, where m is an integer equal to or greater than 2, wherein said amplifying unit comprises an amplifier arranged between an output of a first-stage filter and an input of a succeeding, second-stage filter in at least one pair among a plurality of pairs of filters of adjacent stages.

13. The filter circuit according to claim 12, wherein a noise component amplified by said amplifier is attenuated by the succeeding-stage filter.

14. The filter circuit according to claim 12, wherein at least one of said 1st-order filter and said 2nd-order filter comprises a gm-C filter including an OTA (Operational Transconductance Amplifier) and a capacitor which is charged with a current output from the OTA, said current corresponding to an input voltage supplied to the OTA.

15. The filter circuit according to claim 12, wherein a voltage gain of said amplifier is variably controlled.

16. The filter circuit according to claim 14, wherein said gm-C filter constituting said 1st-order filter and/or said 2nd-order filter includes at least one OTA whose mutual conductance gm is variably controlled.

17. The filter circuit according to claim 12, wherein a gain of said amplifying unit is variably controlled.

18. A filter circuit having an order of three or more, comprising:
   at least one $2^{nd}$-order LPF stage;
   a plurality of low pass filter (LPF) stages cascaded-connected to each, each said LPF stage comprising one of a $1^{st}$-order LPF stage and a $2^{nd}$-order LPF stage, at least one of said $1^{st}$-order LPF and $2^{nd}$-order LPF stages comprising a gm-C filter including an OTA (Operational Transconductance Amplifier) and a capacitor which is charged with a current output from the OTA, said current corresponding to an input voltage supplied to the OTA; and
   an amplifier interconnecting said at least one $2^{nd}$-order LPF stage with said cascaded-connected LPF stages, wherein an amplifier interconnects each said LPF stage in said plurality of stages.

19. The filter of claim 18, wherein said filter comprises one of:
   an inverse Chebychev filter wherein a pass band and a stop band relationship is functionally inversed in a design process;
   an elliptic (cauer) filter;
   a Butterworth filter;
   a Chebychev filter; and
   a Bessel filter.

20. A filter circuit having an order of three or more, comprising:
   a plurality of low pass filter (LPF) stages cascaded-connected to each other, each said stage comprising one of a $1^{st}$-order LPF stage and a $2^{nd}$-order LPF stage, at least one of said $1^{st}$-order LPF and $2^{nd}$-order LPF stages comprising a gm-C filter including an OTA (Operational Transconductance Amplifier) and a capacitor which is charged with a current output from the OTA, said current corresponding to an input voltage supplied to the OTA; and
   an amplifier interconnecting each said LPF stage in said plurality of stages, wherein:
   each said $1^{st}$-order LPF stage comprises:
      a first OTA having a differential input and a differential output;
      a second OTA having a differential input and a differential output, said differential input of said second OTA being connected to said differential output of said first OTA, said differential output of said second OTA being connected to said differential input of said second OTA; and
      first and second capacitors, first connections of said first and second capacitors being connected to a ground and second connections of said first and second capacitors being connected to said differential output of said second OTA; and
   each said $2^{nd}$-order LPF stage comprises:
      a third OTA having a differential input and a differential output and having associated therewith third and fourth capacitors, first connections of said third and fourth capacitors being connected to said ground and second connections of said third and fourth capacitors being connected to said differential output of said OTA;
      a fourth OTA having a differential input and a differential output, said differential input of said fourth OTA being connected to said differential output of said third OTA;
      a fifth OTA having a differential input and a differential output, said differential input of said fifth OTA being connected to said output of said fourth OTA, said differential output of said fifth OTA being connected to said differential input of said fourth OTA in a criss-cross manner;
      a sixth OTA having a differential input and a differential output, said differential input of said sixth OTA being connected to said differential input of said sixth OTA and to said differential input of said fifth OTA;
      fifth and sixth capacitors, first connections of said fifth and sixth capacitors being connected to said differential input of said third OTA and second connections of said fifth and sixth capacitors being connected to said differential output of said fourth OTA; and
      seventh and eight capacitors, first connections of said seventh and eight capacitors being connected to said ground and second connections of said seventh and eight capacitors being connected to said differential output of said fourth OTA.

* * * * *